US008970006B2

(12) United States Patent
Renna

(10) Patent No.: US 8,970,006 B2
(45) Date of Patent: Mar. 3, 2015

(54) VERTICAL CONDUCTIVE CONNECTIONS IN SEMICONDUCTOR SUBSTRATES

(75) Inventor: Crocifisso Marco Antonio Renna, Gela (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 98 days.

(21) Appl. No.: 13/160,757

(22) Filed: Jun. 15, 2011

(65) Prior Publication Data

US 2011/0304024 A1 Dec. 15, 2011

(30) Foreign Application Priority Data

Jun. 15, 2010 (IT) .............................. TO2010A0514

(51) Int. Cl.
*H01L 23/544* (2006.01)
*H01L 21/768* (2006.01)
*H01L 23/48* (2006.01)

(52) U.S. Cl.
CPC ........ *H01L 21/76898* (2013.01); *H01L 23/481* (2013.01); *H01L 2224/05* (2013.01); *H01L 2224/05022* (2013.01); *H01L 2224/05025* (2013.01); *H01L 2224/0557* (2013.01); *H01L 2224/05571* (2013.01); *H01L 2224/13* (2013.01); *H01L 2224/13022* (2013.01); *H01L 2224/14* (2013.01)
USPC ..................... 257/620; 257/621; 257/E21.523

(58) Field of Classification Search
USPC ........... 257/620, 777, 431, 621, 622, E21.523
See application file for complete search history.

(56) References Cited

U.S. PATENT DOCUMENTS

| 4,984,358 | A | 1/1991 | Nelson |
| 8,476,738 | B2 * | 7/2013 | Liu ................................ 257/622 |
| 2006/0267125 | A1 * | 11/2006 | Huang et al. ................... 257/433 |
| 2008/0274603 | A1 | 11/2008 | Do et al. |
| 2010/0200959 | A1 * | 8/2010 | Sasaki et al. ................... 257/620 |

FOREIGN PATENT DOCUMENTS

| DE | 10308855 | 9/2004 |
| EP | 1351288 | 10/2003 |
| JP | 2008135763 | 6/2008 |

OTHER PUBLICATIONS

Search Report for Italian Application No. TO20100514, Ministero dello Sviluppo Economico, Oct. 27, 2010, pp. 2.

* cited by examiner

*Primary Examiner* — Hoai V Pham
(74) *Attorney, Agent, or Firm* — Allen, Dyer, Doppelt, Milbrath & Gilchrist, P.A.

(57) ABSTRACT

An embodiment of a die comprising: a semiconductor body including a front side, a back side, and a lateral surface; an electronic device, formed in said semiconductor body and including an active area facing the front side; a vertical conductive connection, extending through the semiconductor body and defining a conductive path between the front side and the back side of the semiconductor body; and a conductive contact, defining a conductive path on the front side of the semiconductor body, between the active area and the vertical conductive connection, wherein the vertical conductive connection is formed on the lateral surface of the die, outside the active area.

16 Claims, 18 Drawing Sheets

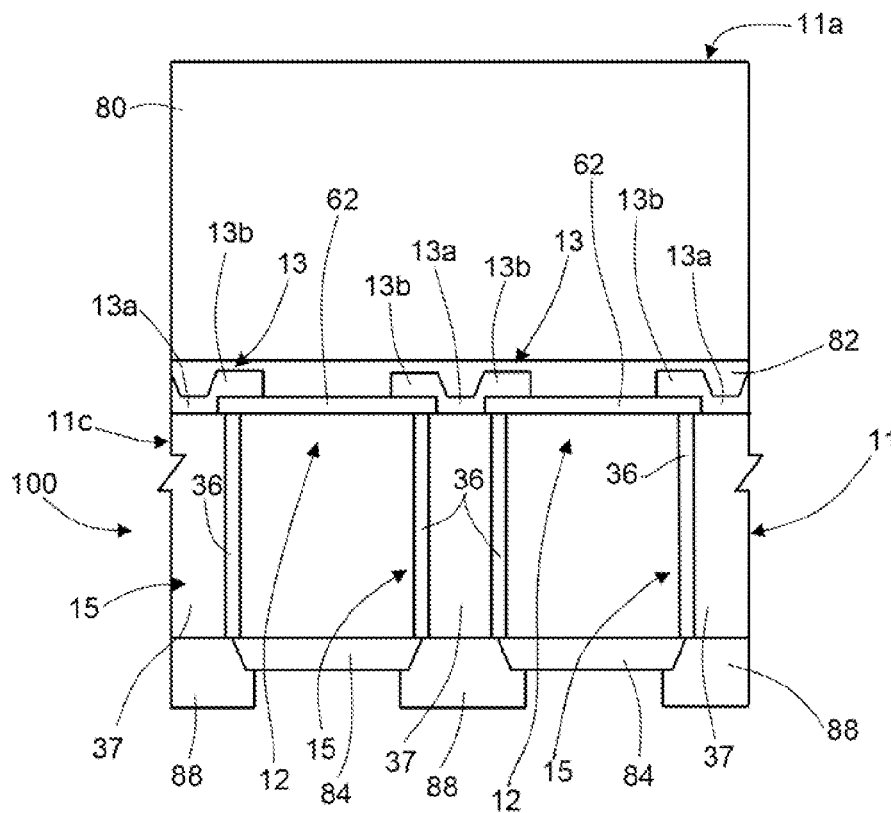
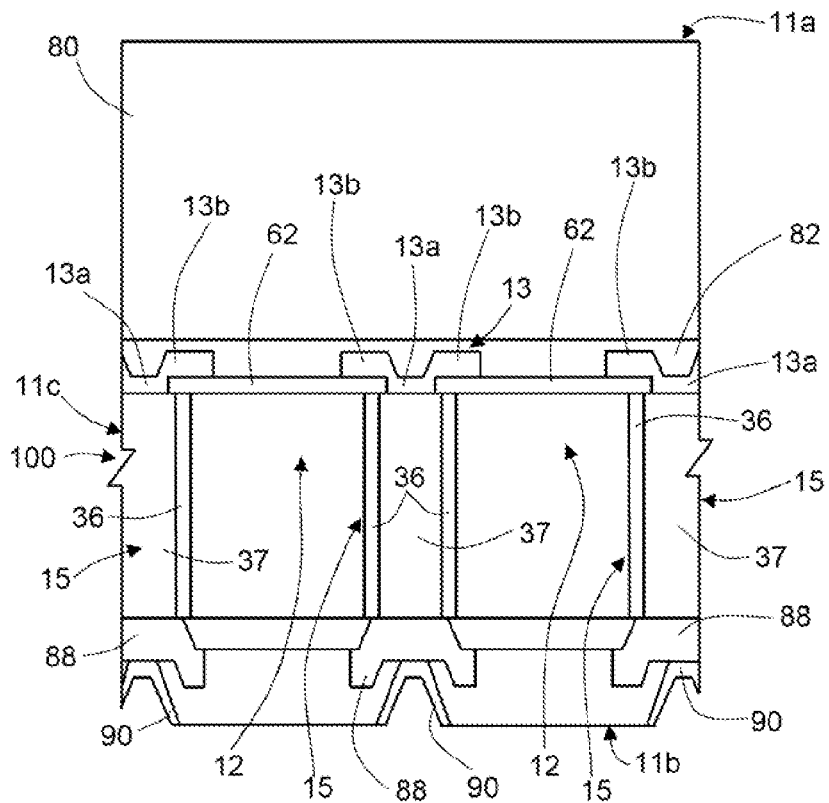

VERTICAL CONDUCTIVE CONNECTIONS IN SEMICONDUCTOR SUBSTRATES

PRIORITY CLAIM

The instant application claims priority to Italian Patent Application No. TO2010A000514, filed Jun. 15, 2010, which application is incorporated herein by reference in its entirety.

TECHNICAL FIELD

An embodiment relates to a die comprising a plurality of vertical conductive connections, to a wafer comprising a plurality of said dies, and to a corresponding manufacturing method.

BACKGROUND

Sensor modules are known, for example light sensors, comprising a plurality of submodules arranged alongside one another to provide an array. Each submodule comprises, for example, a die of semiconductor material housing an electronic device, for example, a light-sensor device.

A conventional sensor module in the form of an array may be formed on a substrate (previously machined and comprising a plurality of electronic devices and/or electrical connections or pads) or on a printed-circuit board (PCB) by arranging a plurality of dies alongside one another for providing a sensitive module of larger size. Each die is arranged at a minimum distance from the other dies to minimize occupation of area and increase as much as possible the resolution of the sensor module as a whole, in accordance with the manufacturing tolerances. However, one of the main reasons for occupation of useful area is linked to the fact that each die is generally surrounded by a plurality of electrical-connection pads provided on the substrate and used for enabling an electrical connection between the die and the substrate itself. The electrical connections between the pads and each device are generally provided by means of wire-bonding techniques so as to enable electrical connection of each pad present on the substrate or PCB with a respective pad present on the device.

The presence of the pads on the device and on the substrate (or likewise on the PCB) and of the wires for electrical connection between them may cause a considerable occupation of area, with consequent increase in the dimensions of the final module, reduction of the fill factor (sensitive area/total area) and loss of resolution.

In order to partially overcome this problem, it may be possible to form vertical connections by forming deep trenches from the back of the substrate until the opposite surface, where the conductive pads are provided, is reached. Said vertical connections, filled with conductive material, are then used for providing the electrical connection between the front of the die and, for example, a printed-circuit board on which the die is mounted. In this way, a region of the printed-circuit board surrounding the die is recovered.

However, even though the latter approach reduces the occupation of area enabling a greater lateral approach between the dies arranged on the printed-circuit board, an increase in the fill factor is not guaranteed. The vertical connections, in fact, occupy a portion, that may prove significant, of the active area of each die. Said occupied portion often cannot be used for the purposes envisaged (for example, detection of light in the case of dies housing a light sensor). What has been said is evident from FIG. 1, which shows, in top plan view, a portion 7 of a wafer on which a plurality of sensor devices 1 are provided, for example, light-sensor devices. Each sensor device 1 comprises an active-area region 5, comprising a plurality of vertical conductive connections 3, also known as through silicon vias (TSVs). The useful active area is indicated in FIG. 1 with a dashed line and designated by the reference number 2, and has an extension visibly smaller than the total active area 5 on account of the presence of the TSVs.

Each sensor device 1 is separated from the other sensor devices 1 on the wafer by respective safety regions 6. At the end of the steps for manufacturing the sensor devices 1, the latter are separated from one another by means of a dicing step. Dicing is carried out along scribe lines 4 (ideally indicated in the figure with a dashed line) within the safety regions 6. The safety regions 6 have a function of preventing the sensor devices 1 from undergoing damage during the process of dicing of the wafer.

At the end of the dicing step a plurality of dies is obtained, each of which includes a single sensor device 1.

From FIG. 1 it is evident how the plurality of conductive connections 3 may cause a significant reduction of useful sensitive area with respect to the total surface of each die.

SUMMARY

An embodiment is a die comprising a plurality of vertical conductive connections, a wafer comprising a plurality of said dies, and a corresponding manufacturing method.

BRIEF DESCRIPTION OF THE DRAWINGS

For a better understanding of the disclosed subject matter, one or more embodiments are now described, purely by way of non-limiting example, with reference to the attached drawings, wherein:

FIGS. 20-24 show manufacturing steps, subsequent to the steps shown in FIGS. 10-19 and according to a same embodiment shown in said figures, for obtaining vertical conductive connections, in a view along the line of section III-III of FIG. 2;

DETAILED DESCRIPTION

Figure 1:
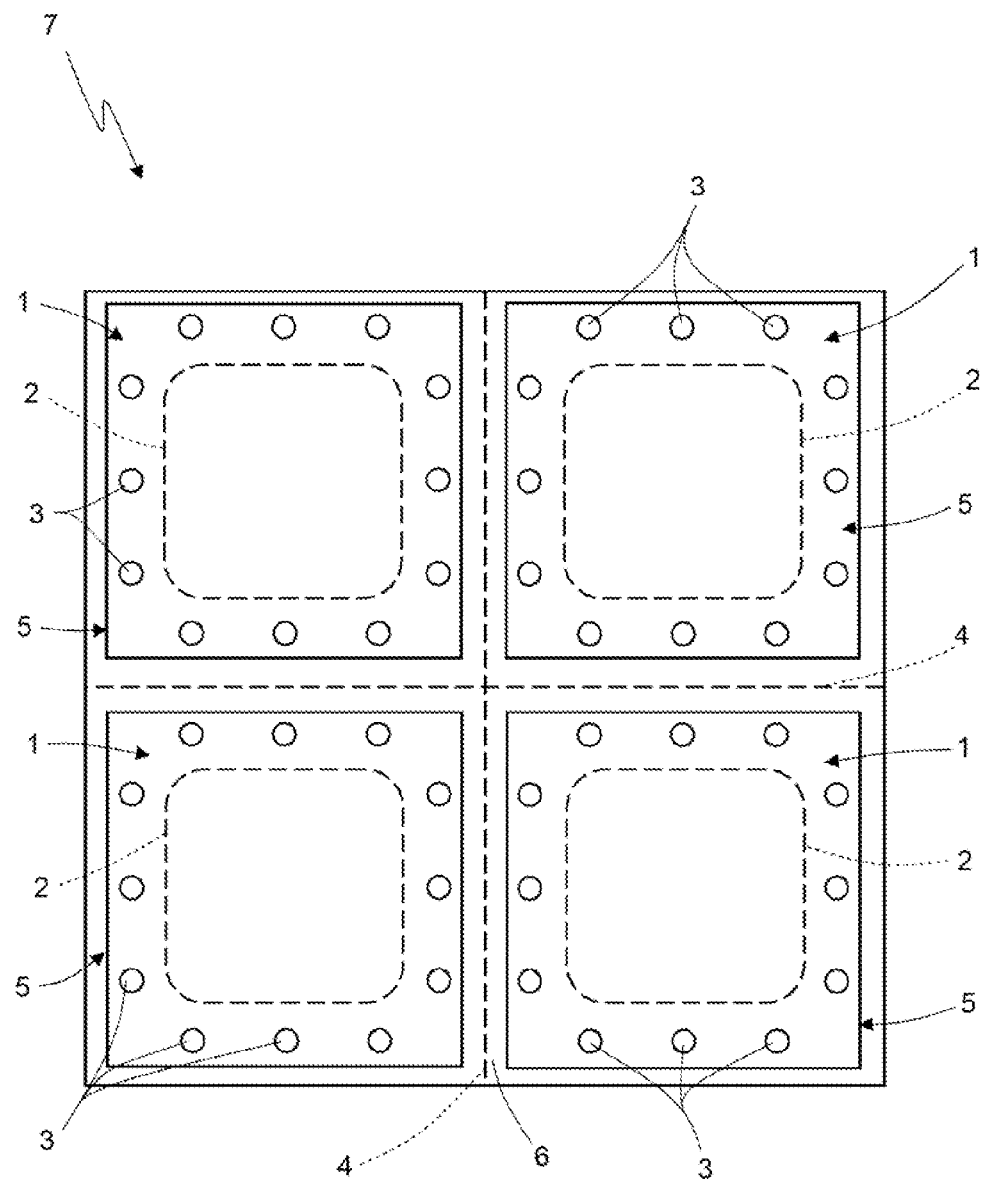
FIG. 1 shows, in top plan view, a portion of a wafer comprising a plurality of dies provided with vertical conductive connections of a known type.
Figure 2:
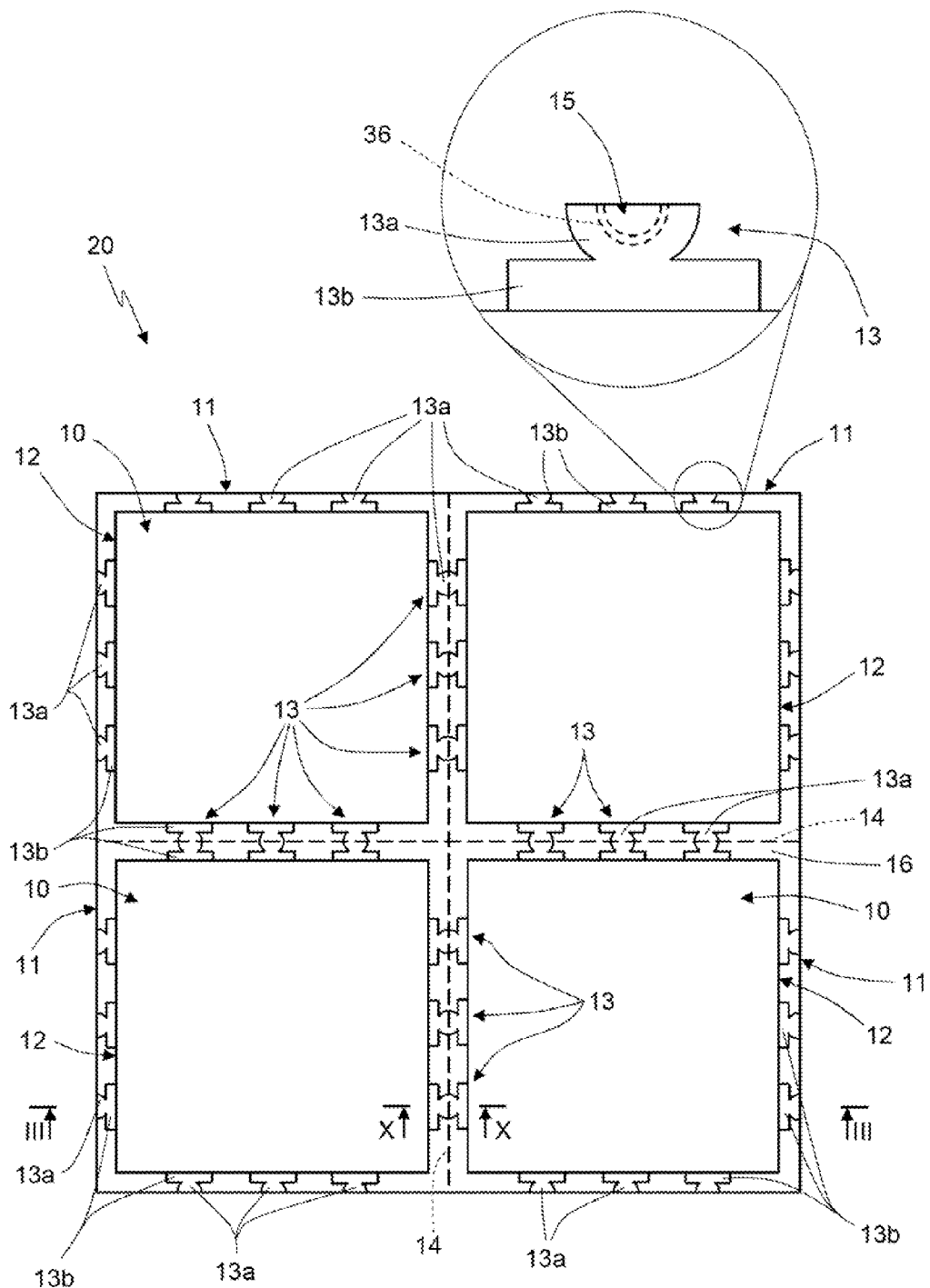
FIG. 2 shows, in top plan view, a portion of a wafer comprising a plurality of dies provided with vertical conductive connections according to an embodiment.
Figure 3:
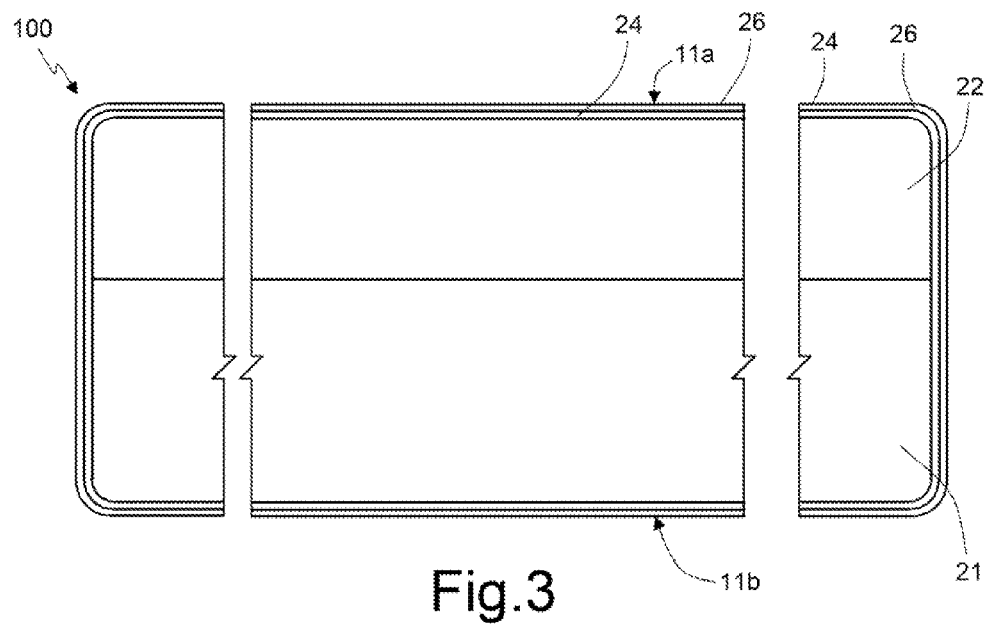
FIGS. 3-8 show successive manufacturing steps for obtaining vertical conductive connections according to an embodiment, in a view along the line of section III-III of FIG. 2.
Figure 4:
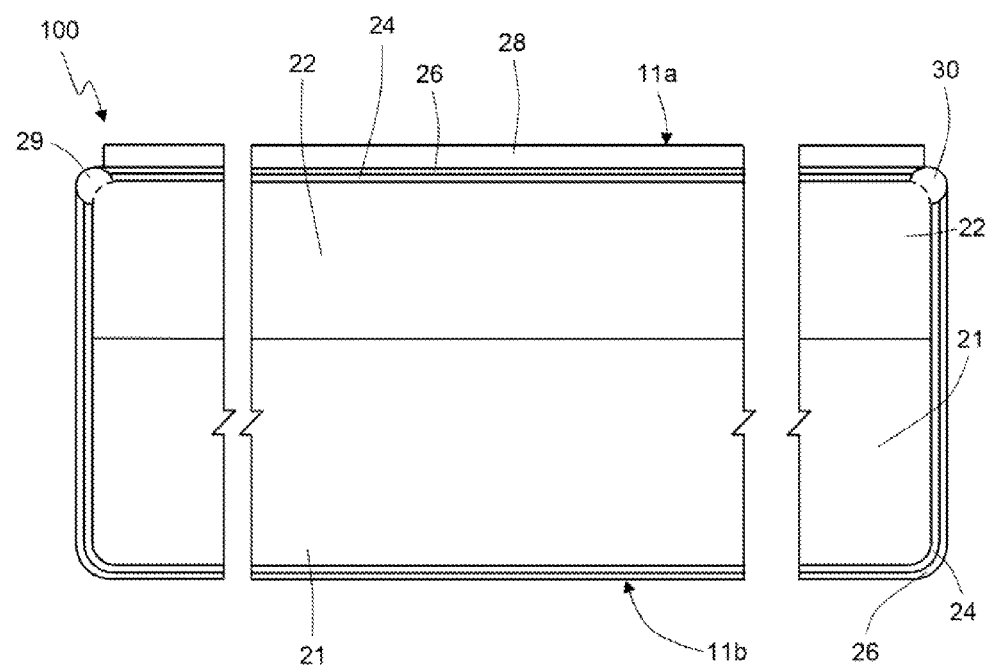
Figure 5:
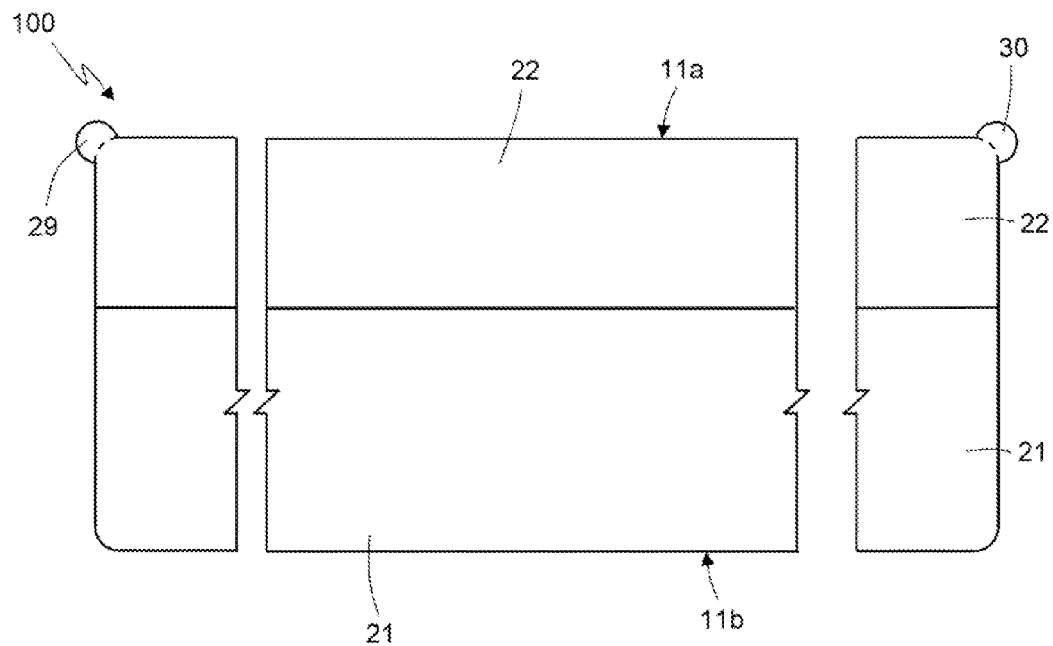
Figure 6:
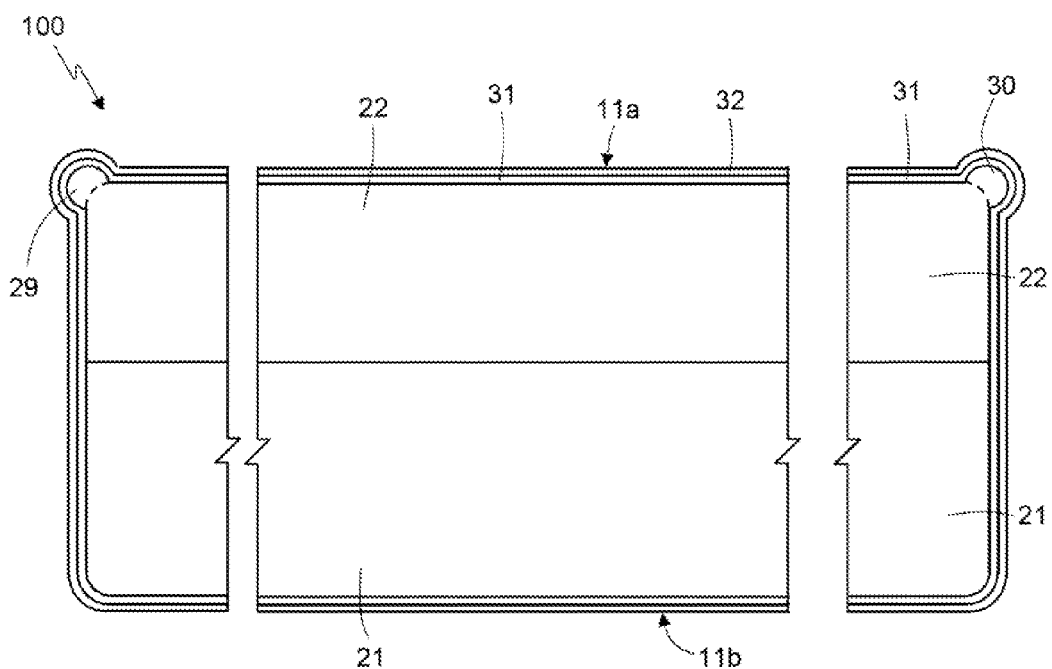
Figure 7:
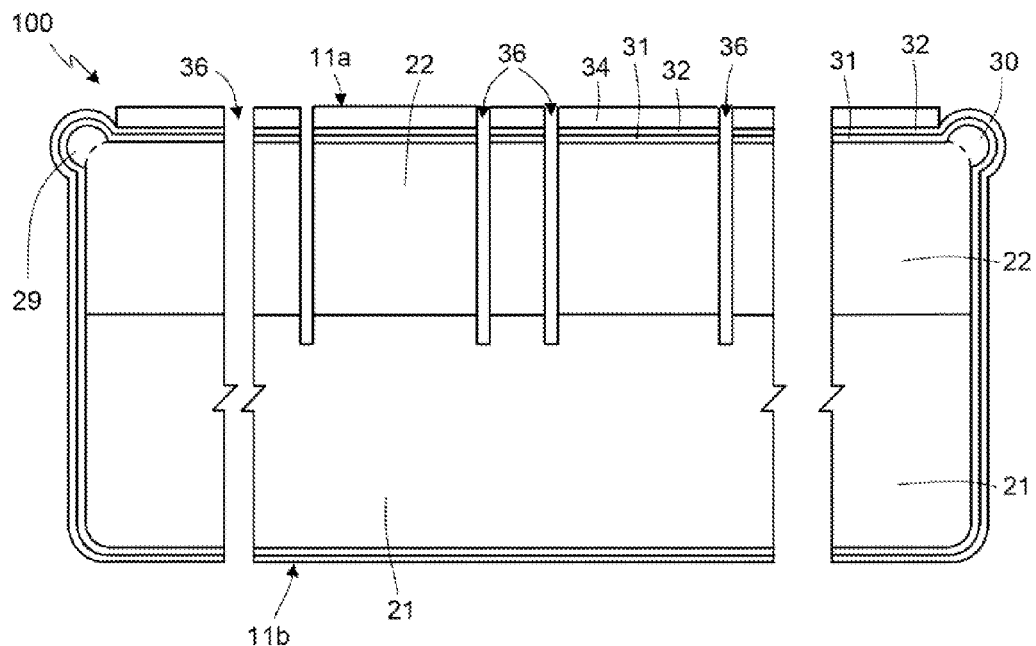

FIG. 2 shows, in top plan view according to an embodiment, a portion 20 of a wafer (not shown as a whole, for example the wafer 100 or the wafer 200 according to embodiments described hereinafter with reference to FIGS. 3-24 and FIGS. 25-30, respectively), which comprises a plurality of dies 11 (joined to one another along scribe lines 14), in which each die includes a respective sensor device 10.

The sensor devices 10 are separated from one another by safety regions 16, designed to guarantee safe dicing of the wafer for physical separation of the dies 11 that include the sensor devices 10 so as to minimize damage to the sensor devices 10 themselves. Dicing is carried out along the scribe lines shown in FIG. 2 with a dashed line and designated by the reference number 14.

A plurality of contact connections 13 are formed within the safety regions 16, specularly with respect to the scribe lines 14. As may be seen more clearly in the enlarged portion of FIG. 2, each contact connection 13 comprises a central portion 13a and a lateral portion 13b, electrically coupled to one another.

Figure 31:
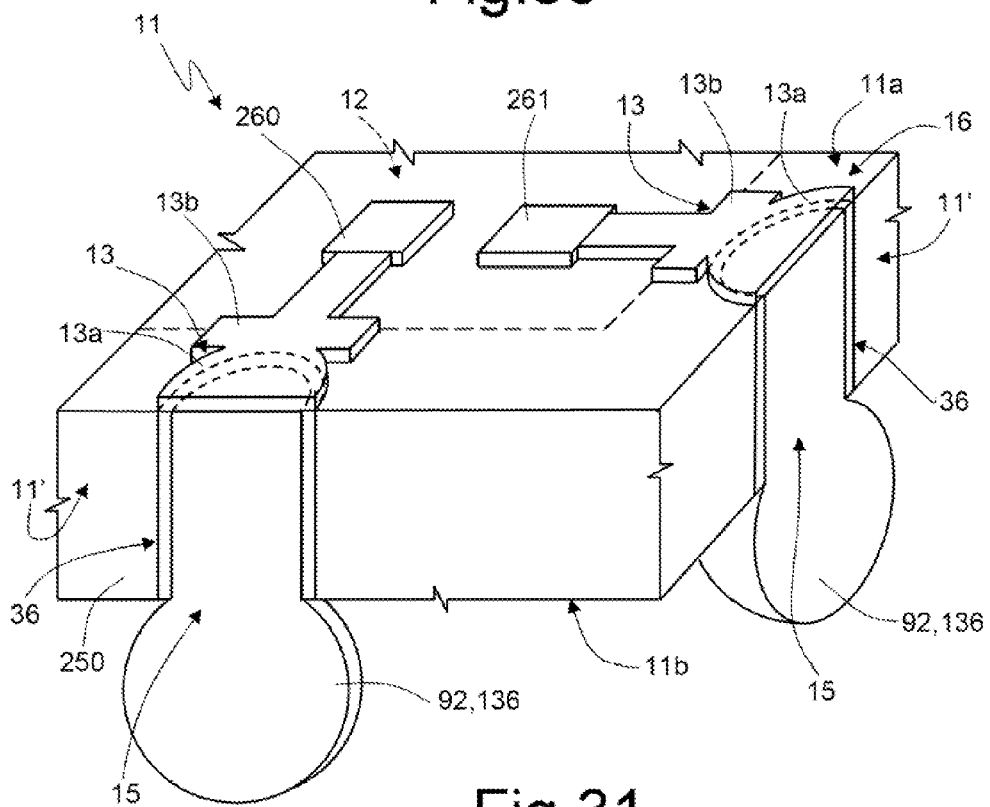
FIG. 31 shows a perspective view of a portion of a die, visible in which are vertical conductive connections provided so that they face lateral surfaces of the die, according to an embodiment.

The central portion 13a has, for example, a semicircular shape in top plan view (but any other shape is possible, for example polygonal) and is arranged facing a lateral surface 11c of the die 11 (see, for example, FIG. 31).

The lateral portions 13b of the contact connections 13 are designed to provide an electrical coupling between an active-area region 12 of a respective sensor device 10 and the central portion 13a.

The central portion 13a is in electrical coupling with a vertical conductive coupling 15 (known as a "via hole" or "TSV"), extending vertically within the wafer substantially in an area corresponding to the central portion 13a, and hence in an area corresponding to the safety region 16 (and to the scribe line 14). Each via hole 15 extends starting from the front of the wafer throughout the entire thickness thereof, until the back of the wafer is reached, setting in electrical communication the front of the wafer with the back of the wafer itself. Each via hole 15 is moreover insulated from the rest of the die 11 by means of an insulating region 36 (or trench), which also extends throughout the thickness of the wafer.

The insulating region 36 and the via hole 15, have, in perspective view, for example, a semicylindrical shape, but other shapes are possible, for example with a polygonal base.

Following upon the step of dicing and separation of the sensor devices 10, each via hole 15 sets in electrical communication a front region of the sensor device 10 (in the example shown comprising the contact connection 13) with a respective back region of the sensor device 10 itself.

On the back of the wafer (and, likewise, of each die 11 after the dicing step), conductive bumps are present, each of which are in electrical coupling with a single via hole 15. According to an embodiment, the bumps are formed laterally arranged at a distance from each via hole 15, and are coupled to each respective via hole 15 by means of a metal conductive path, obtained with known techniques on the back of the wafer (redistribution layer). According to another embodiment, the bumps are formed vertically aligned to, and in electrical contact with, each via hole 15.

In this way, selective portions of active area of each sensor device 10 are in electrical coupling, via the contact couplings 13 provided within the safety regions 16 and via a respective via hole 15 extending vertically in a point corresponding to the safety regions themselves, with the back of each sensor device 10, and hence with a respective conductive bump.

In this way, the extension of the active-area region 12 may be maximized, since the via holes are provided outside of the active-area region 12, and in particular in points corresponding to the scribe lines 14.

There now follows a description, with reference to FIGS. 3-24, of a process for producing via holes in the safety regions 16 (in which dicing is carried out along the scribe lines 14), according to an embodiment.

FIGS. 3-24 show a cross-sectional view of a portion of a wafer 100 during successive manufacturing steps according to an embodiment. In particular, with reference to FIG. 2, FIGS. 3-24 show a cross-sectional view along the line of section III-III.

Since FIGS. 3-8 refer to process steps corresponding to a portion of wafer external to the cross section III-III, said figures show, for greater clarity, also edge portions of the wafer. Said edge portions are arranged laterally with respect to the cross section III-III, as a lateral prolongation of the cross section III-III itself.

In addition, during the steps of formation of the via holes, further steps may be envisaged for forming the sensor devices 10. Alternatively, the sensor devices 10 may be formed prior to the steps described with reference to FIGS. 3-24. For simplicity of description, and considering that the process disclosed may be applied to any type of device, the steps of formation of the sensor devices 10 will not be described.

In the first place (FIG. 3), a wafer 100 is provided having a front side (in what follows designated by the reference number 11a) and a back side (in what follows designated by the reference number 11b).

The wafer 100 comprises a substrate 21, made, for example, of silicon. Grown on said substrate 21 is an epitaxial layer 22, for example made of doped silicon of a P− type.

According to an embodiment, the growth of the epitaxial layer 22 is optional, and may hence be omitted. In this case, the manufacturing steps described with reference to the subsequent figures are carried out directly on the substrate 21.

Then formed over the entire wafer 100 is an insulating layer 24, for example silicon oxide deposited by a chemical vapor deposition (CVD) technique or grown thermally, having a thickness of between approximately a few nanometers (nm) and a few micrometers, for example, approximately 25 nm. On top of the insulating layer 24, over the entire wafer 100, a dielectric layer 26 is formed, for example made of nitride deposited by low-pressure chemical vapor deposition (LPCVD), having a thickness comprised between approximately a few nanometers and a few micrometers, for example, approximately 70 nm.

Next (FIG. 4), on the front 11a of the wafer 100, formed on top of the dielectric layer 26 is a mask layer 28, made, for example, of photoresist. Then formed, in edge corner regions not covered by the mask layer 28 are edge-protection elements 29, 30. For this purpose, selective portions of the insulating 24 and dielectric 26 layers are removed from peripheral regions of the wafer 100 in which it is desired to form the edge-protection elements 29, 30, thus exposing the epitaxial layer 22. For example, by thermal growth of silicon oxide, and exploiting the selectivity of oxidation rates offered between the crystalline-silicon surfaces and the nitride surfaces (oxidation practically zero), edge-protection elements 29, 30 are formed in the peripheral regions of the wafer 100 that present the epitaxial layer 22 exposed.

Since during etching steps, for example RIE or wet etching, the edge corner regions are etched with a higher rate as compared to central regions of the wafer 100, the edge-protection elements 29, 30 have the function of achieving, as final result, a uniformity of the thickness of the etched wafer 100. The edge-protection elements 29, 30 have a thickness comprised between approximately some fractions of a micrometer and a few micrometers, for example, approximately 1.3 μm.

The mask layer 28, the dielectric layer 26 and the insulating layer 24 are then removed (FIG. 5), for example by means of wet etching. Removal of the insulating layer 24 causes a reduction of the thickness of the edge-protection elements 29, 30, which are also, in the example described, made of silicon oxide. However, given the greater thickness of the edge-protection elements 29, 30 as compared to the insulating layer 24, said reduction of thickness may be considered non-significant.

Next (FIG. 6), an insulating layer 31, made, for example, of silicon oxide, is formed over the entire wafer 100 and then a dielectric layer 32, made for example of nitride, is formed, having a thickness comprised between approximately a few nanometers and a few micrometers, for example, approximately 140 nm.

Then (FIG. 7), on the front 11a of the wafer 100 a mask layer 34 is formed, made, for example, of photoresist, and, by means of successive steps of lithography and selective etching, a plurality of holes 35 are defined in the mask layer 34, in points corresponding to the regions in which it is desired to form the central portions 13a of the contact couplings 13 and the via holes.

Next, by means of etching steps in succession, the dielectric layer 32, the insulating layer 31, the epitaxial layer 22, and the substrate 21 are etched to form trenches 36, which extend in depth in said layers.

Alternatively, the trenches 36 may extend for a smaller depth, without reaching the substrate 21, or again may penetrate within the substrate 21 throughout the thickness of the latter.

In the case where an epitaxial layer 22 has not been formed, the trenches 36 may extend exclusively within the substrate 21.

Figure 8:
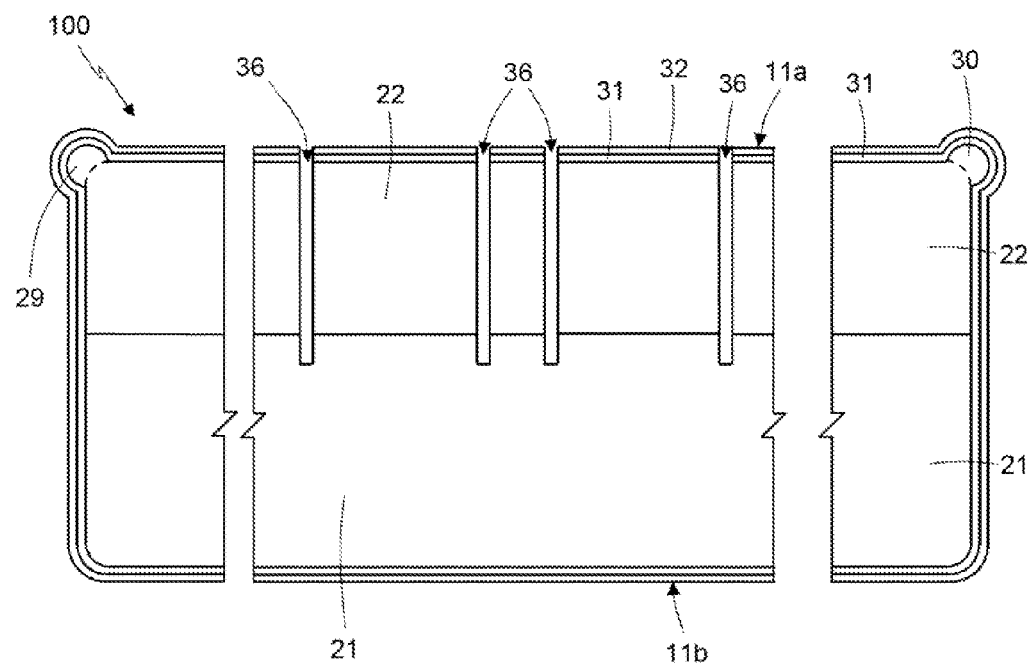

The mask layer 34 is then removed (FIG. 8). Alternatively, the mask layer 34 may be left on the front of the wafer 100 for subsequent manufacturing steps, and then removed.

The trenches 36 extend in the epitaxial layer 22 and/or in the substrate 21 for a depth of between approximately a few micrometers and a few hundreds of micrometers, for example, approximately 100 μm. The trenches 36 may moreover have, in top plan view, a plurality of geometries different from one another, for example having a circular or generally polygonal shape, or else an annular structure with a single ring or with a number of concentric rings, with diameter and/or overall dimensions comprised between approximately a few micrometers and a few hundreds of micrometers.

Irrespective of the geometry chosen, the width of the trench may vary from approximately a few micrometers up to a few hundreds of micrometers, for example, approximately 5 μm.

Figure 9A:
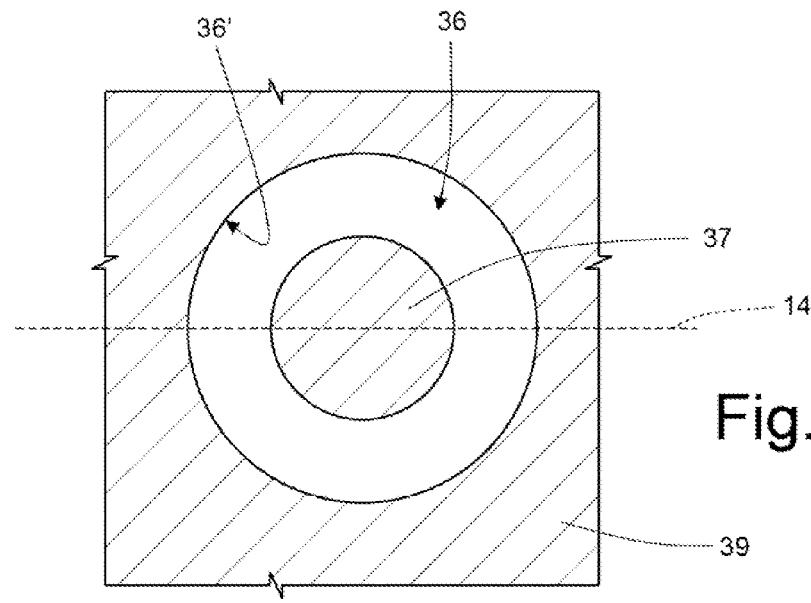
FIGS. 9a and 9b are schematic illustrations in top plan view and perspective view, respectively, of a vertical trench according to an embodiment.
Figure 9B:
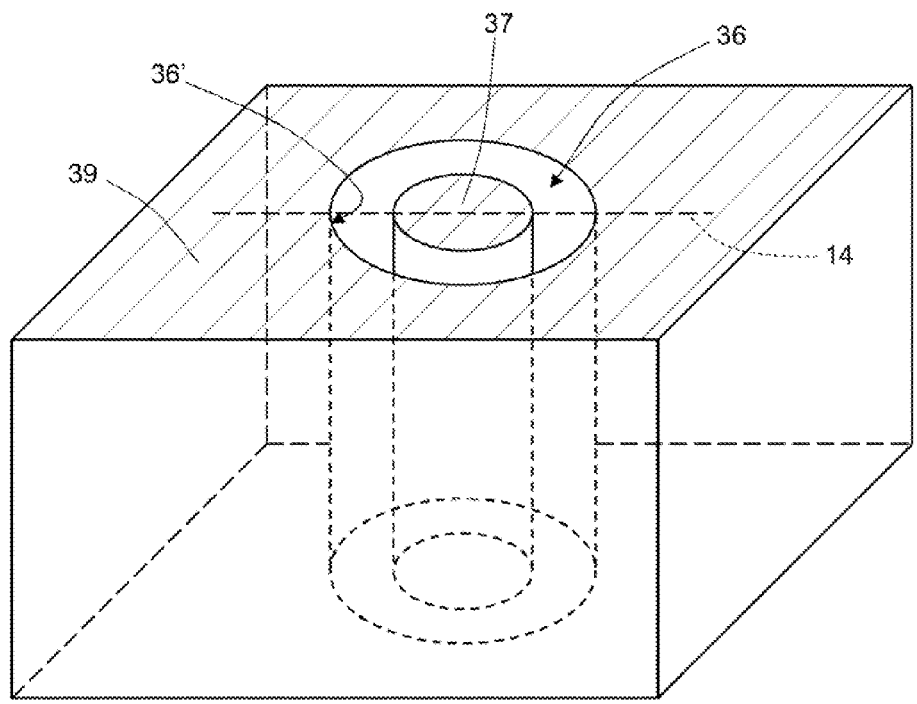

FIG. 9a shows by way of example, in top plan view, the trench 36, whilst FIG. 9b shows the same trench 36 in perspective view in the case of a single-ring structure. As may be noted from FIGS. 9a and 9b, the trench 36 has, according to an embodiment, a cylindrical shape and defines in the epitaxial layer 22 and in the substrate 21 an internal region 37 and an external region 39. The trench 36 delimits the external region 39 via a wall 36'.

Also shown by way of example in FIGS. 9a and 9b is a possible scribe line 14, which divides the trench 36 substantially in half.

FIGS. 10-19 refer to an enlarged portion of the wafer 100, taken along the line of section X-X of FIG. 2. Said view is useful for showing in greater detail the successive machining steps. What is described with reference to FIGS. 10-19 applies also to the other trenches 36 present on the wafer 100.

Figure 10:
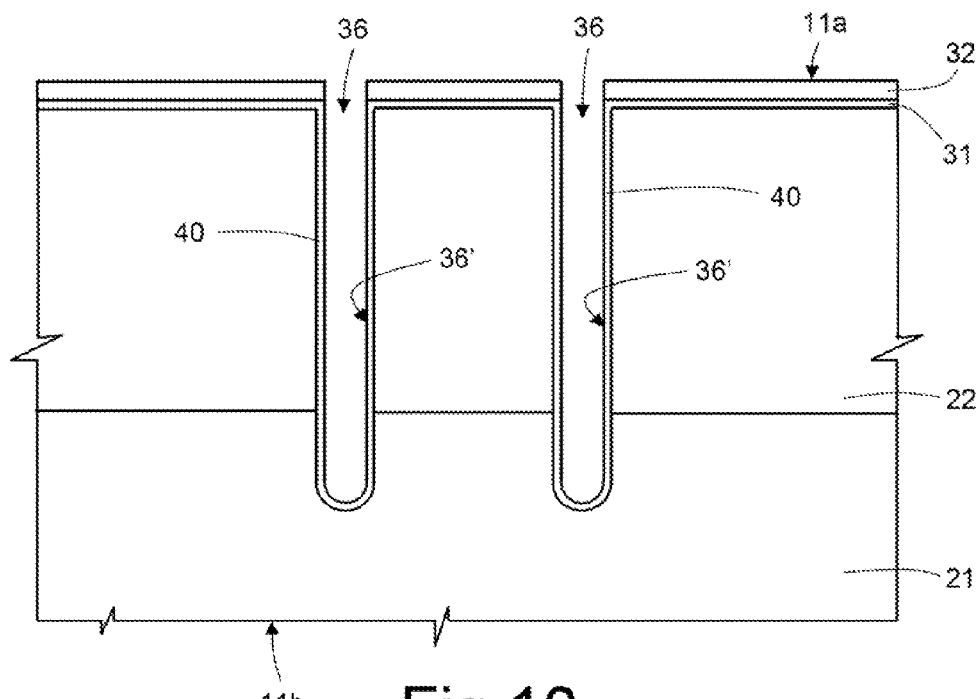
FIGS. 10-19 show manufacturing steps, subsequent to the steps shown in FIGS. 3-8 and according to a same embodiment shown in said figures, for obtaining vertical conductive connections, in a view along the line of section X-X of FIG. 2.
Figure 11:
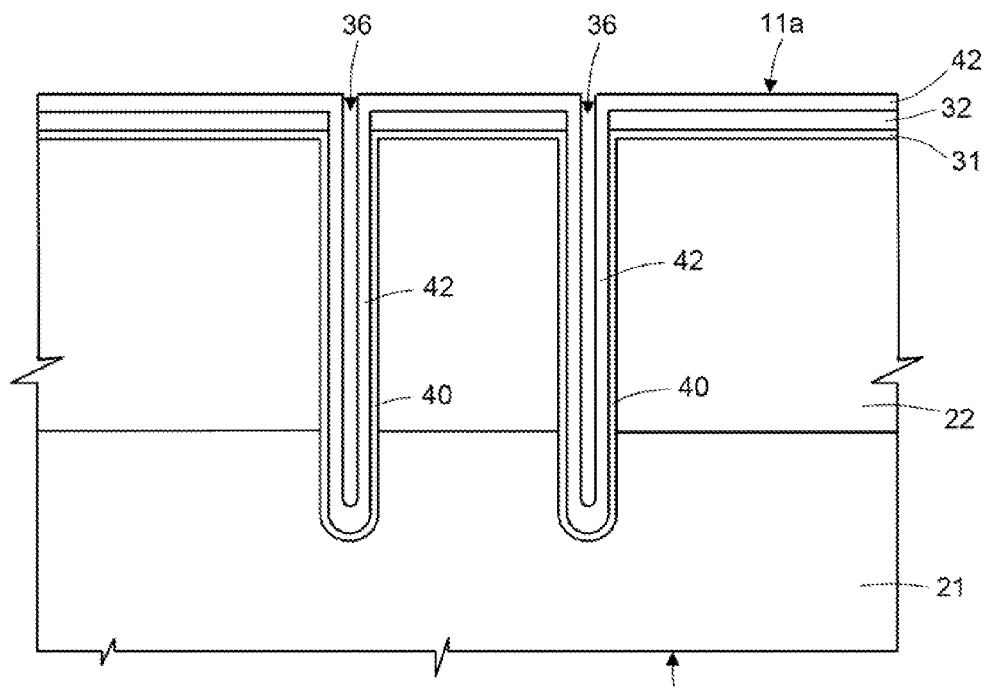
Figure 12:
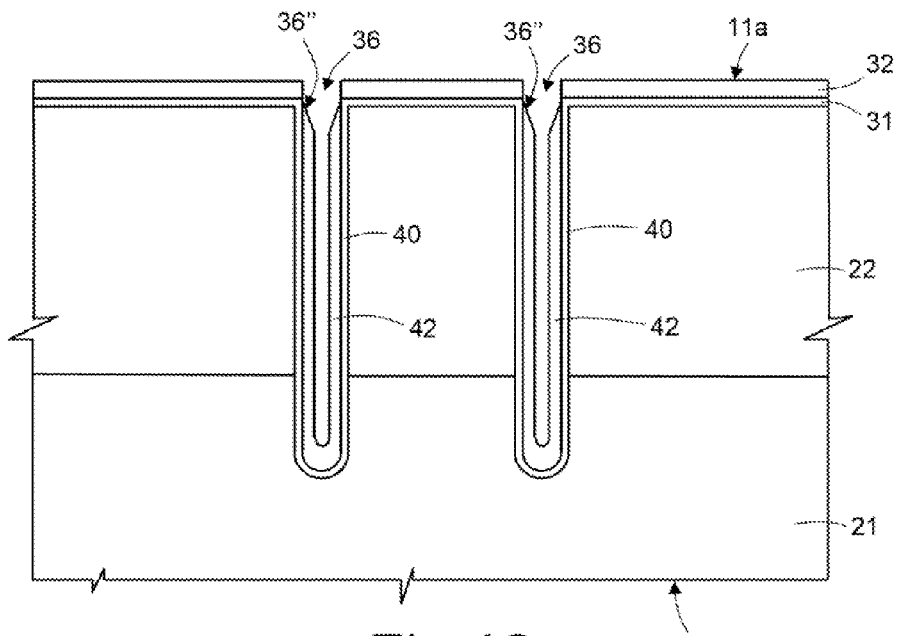
Figure 13:
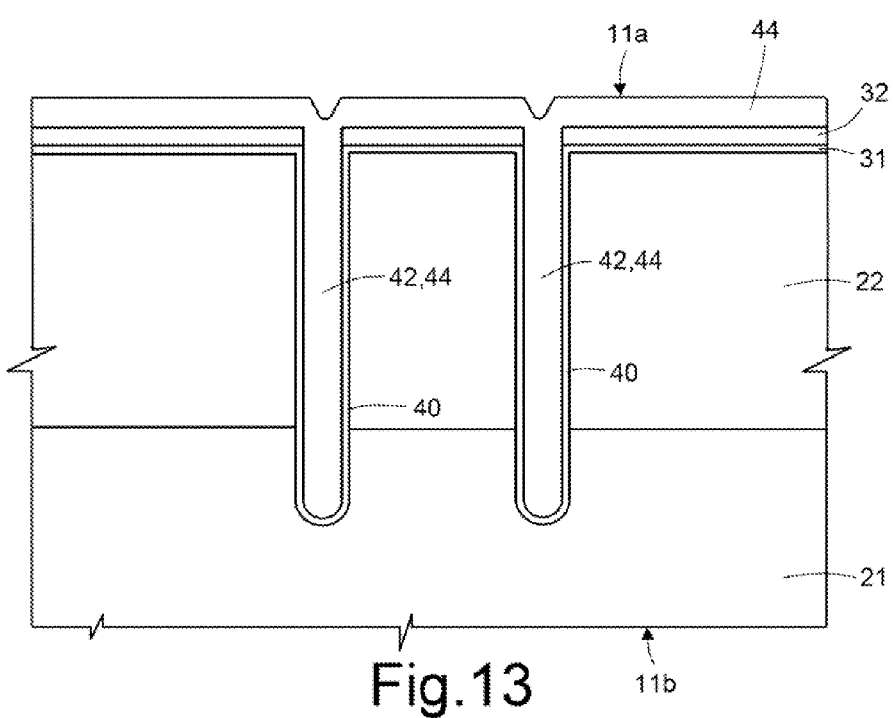
Figure 14:
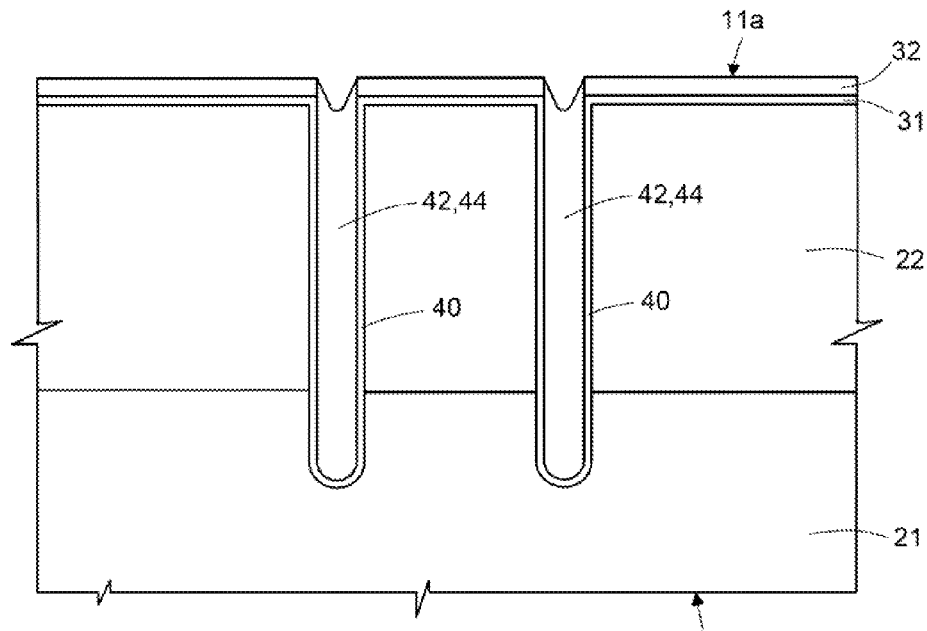

As shown in FIG. 10, an insulating layer 40 made, for example, of silicon oxide is formed on the internal wall 36' of the trench 36. The insulating layer 40 is formed, for example, by means of a process of thermal oxide growth or by CVD, and has a thickness of between approximately a few nanometers and a few micrometers, for example, approximately 900 nm.

Then (FIG. 11), a first fill layer 42 is formed, for example by depositing non-doped polysilicon, within the trench 36, which is in this step only partially filled. The deposition may be carried out, for example, with the LPCVD technique.

Typically, polysilicon deposition using LPCVD is conformal. However, it may happen that, at the corners of the trench 36 in an area corresponding to the front 11a, the fill layer 42 grows faster, closing the trench 36 before the fill layer 42 is completely formed. Consequently, in order to prevent this situation, filling of the trench 36 is carried out in successive steps, with progressive steps of filling of the trench 36 and removal of material that could obstruct the entrance to the trench 36 from the front side 11a. For this purpose (FIG. 12), the fill layer 42 is removed from the front 11a of the wafer 100, for example by means of dry etching (in particular, chemical RIE), and from an entrance portion 36" of the trench 36 close to the front 11a of the wafer 100. The entrance portion 36" of the trench 36 hence assumes, as may be seen in FIG. 12, substantially a V shape.

Next (FIG. 13), formed in the trench 36 is a fill layer 44, made for example of non-doped polysilicon deposited by LPCVD. The fill layer 44 fills the trenches 36 approximately completely and forms on the front 11a of the wafer 100, on top of the dielectric layer 32, a layer with a thickness of approximately 1.5 μm.

It may here be noted that, in the case where filling of the trenches 36 has been completed by deposition alone of the fill layer 42, formation of the fill layer 44 is not necessary. Instead, if further filling steps are desired for filling the trench 36 completely, said further steps may be carried out.

Then (FIG. 14), the fill layer 44 is removed from the front 11a of the wafer 100. When etching the wafer 100 so as to remove the polysilicon selectively, the step of etching of the polysilicon present on the front 11a of the wafer 100 stops at the dielectric layer 32 (nitride in this embodiment), which has the function of an etch-stop layer.

The planarization may be carried out not only by means of chemical etching but also by means of techniques of chemical and mechanical polishing or dry/wet polishing.

Figure 15:
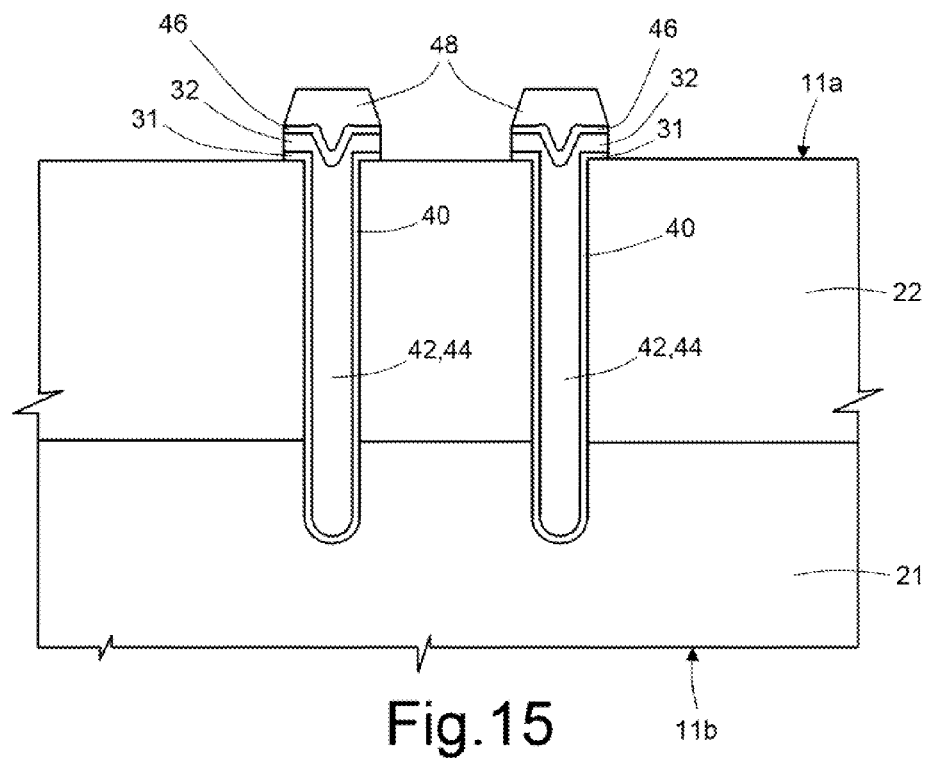
Figure 16:
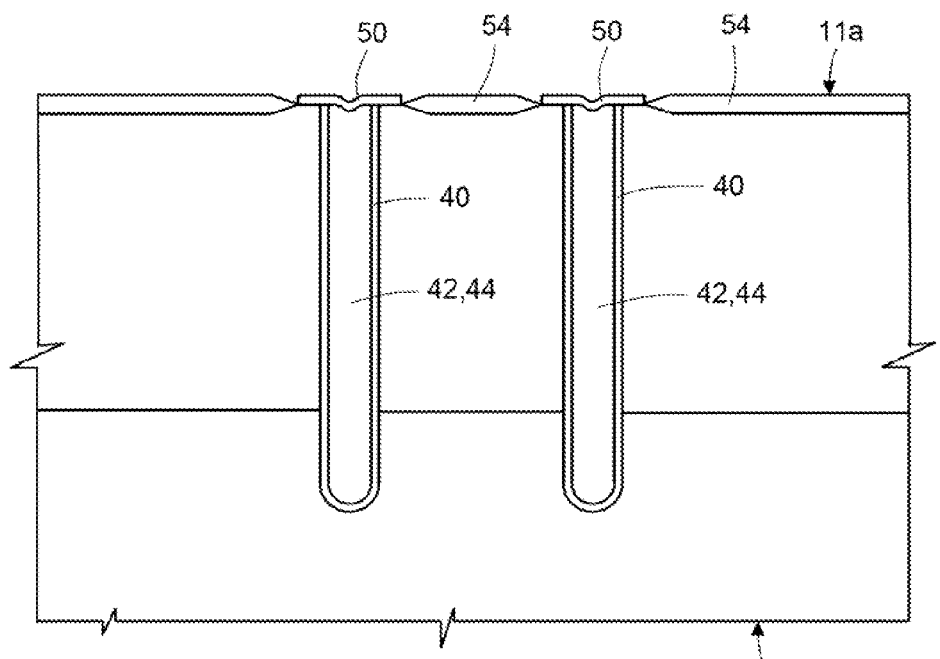

As shown in FIG. 15, then formed on the front 11a of the wafer 100, on top of the dielectric layer 32 and of the trenches 36 filled with polysilicon, is a dielectric layer 46, for example nitride. The dielectric layer 46 has the function of preventing the polysilicon of the dielectric layer 32 from possibly oxidizing, and moreover may have the function of protection from possible steps of implantation that may involve other portions of the wafer 100 (not shown in the figure; for example, regions of the active area). The dielectric layer 46 has a thickness of between approximately a few nanometers and a few micrometers, for example, approximately 70 nm.

Next, on the front 11a of the wafer 100, in an area corresponding to the trenches 36 and on top of them, a mask 48, for example, a photoresist mask, is formed and defined via known steps of lithography and etching. The mask 48 extends, in cross-sectional view, on top of the trenches 36, but also laterally, for approximately 5 µm. Next, subsequent steps of etching for removal from the front 11a of the wafer 100 are carried out, in the regions not protected by the mask 48, the dielectric layer 46, the dielectric layer 32, and the insulating layer 31. The trenches 36 are thus formed.

Next (FIG. 16), a step of formation of an insulating layer 54 is carried out in the exposed regions of the epitaxial layer 22. For example, the insulating layer 54 may be thermally grown silicon oxide, or again silicon oxide deposited by means of known techniques, or another insulating material. The insulating layer 54 has, for example, a thickness of approximately 700 nm, but its thickness may depend upon the final device that it is intended to be obtained. The insulating layer 54, in fact, is the layer on which the active area of the device will be defined.

Then, the mask 48 and the dielectric layers 46, 32 and insulating layer 31 underneath the mask 48 are removed, and a dielectric layer 50 is formed, made for example of nitride, for protection and insulation of the trenches 36, which extends at the sides the trenches 36 in a way substantially similar to the previous mask 48.

The front 11a of the wafer 100 hence has regions of the epitaxial layer 22 exposed and other regions of the epitaxial layer 22, laterally adjacent to the trench 36, protected by the dielectric layer 50.

In order to improve the conductivity of the via holes it may be possible to proceed with implantation and subsequent diffusion of dopant species of a type and with a concentration such as to reduce the resistance of the conductive path.

Then (FIG. 17), a step of implantation of dopant species is carried out in the internal portion 37 of the epitaxial layer 22 and of the substrate 21 (i.e., the portion that is defined internally by the trench 36 and that will constitute, at the end of the manufacturing steps according to the embodiment described here, a vertical conductive path). The implanted dopant species are, according to the embodiment described, of a P type, but in general are of the same type as that of the substrate 21 and of the epitaxial layer 22 (they may, for example, be of an N type) with higher concentration of the doping of the substrate 21 and of the epitaxial layer 22 in order to reduce the electrical resistance.

Figure 17:
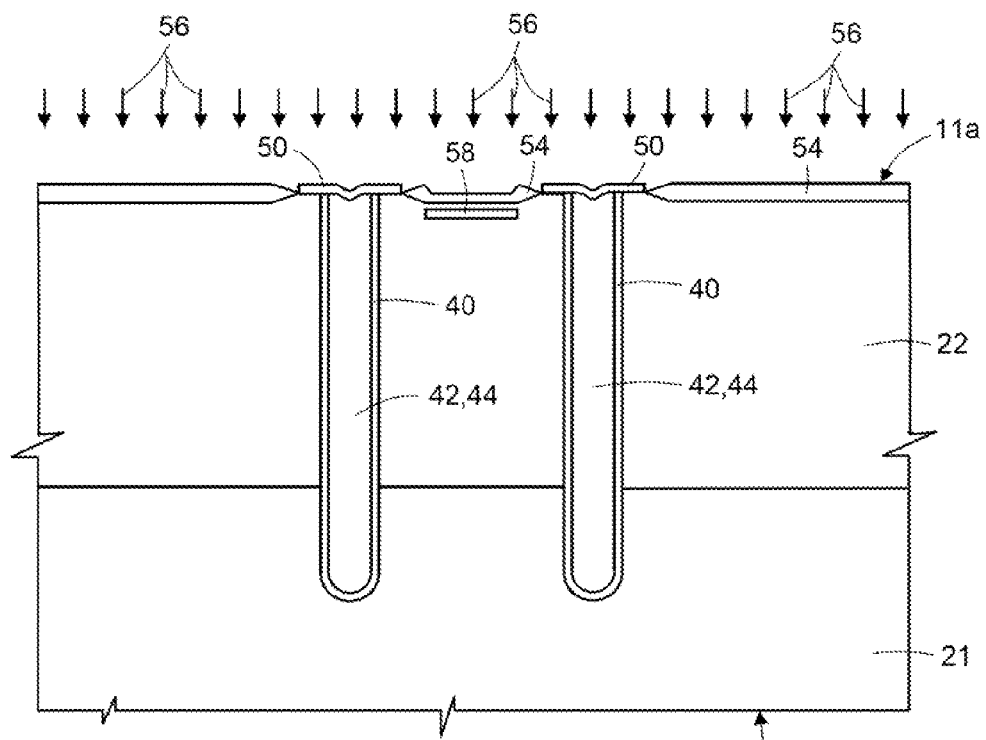

Then, the insulating layer 54 is thinned out (or removed) in an area corresponding to the region of the epitaxial layer 22 in which it is intended to carry out the implantation, and the implantation is performed (schematically represented by arrows 56 in FIG. 17).

By implanting appropriate dopant species (of a P type according to the embodiment described), an implanted region 58 is formed exclusively in an area corresponding to the region of the epitaxial layer 22 in which the insulating layer 54 has been thinned out (or removed) and not where the thickness of the insulating layer 54 has not been reduced.

Figure 18:
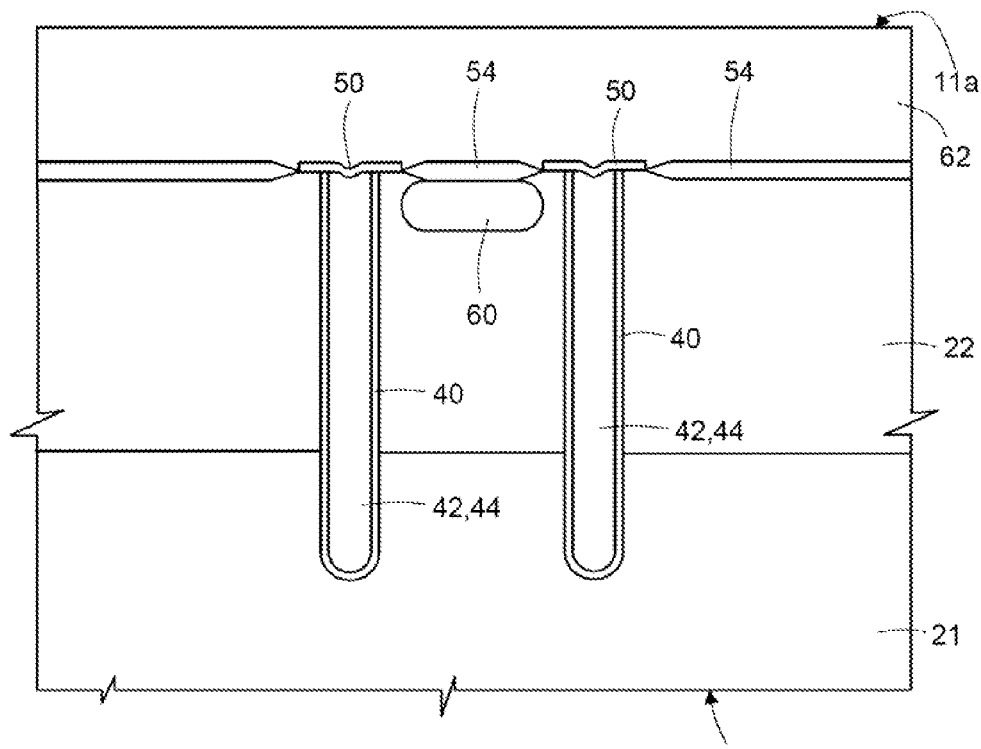

A subsequent step of thermal annealing favors diffusion of the implanted dopant species to form a diffused region 60, of a P++ type (FIG. 18). The level of doping of the diffused region 60 is higher than the level of doping of the epitaxial layer 22 (and hence of the internal portion 37).

As shown in FIG. 18, the step of thermal annealing for favoring diffusion of the implanted dopant species may be carried out simultaneously with a step of thermal growth of silicon oxide in order to restore the thickness of the insulating layer 54 in the areas in which the latter had been thinned out (see the steps described previously). As an alternative to the thermal growth of silicon oxide, or in the case where the insulating layer 54 is not made of silicon oxide, it may be possible to restore the thickness of the insulating layer 54 by means of other techniques, for example deposition techniques of a known type.

Next, processing of the wafer 100 is carried out in order to complete formation of the sensor devices 10. These steps may vary according to the type of sensor device that it is desired to form and are not illustrated in detail in what follows for brevity.

By way of example, in the case of sensor devices 10 for optical detection, such as silicon photomultipliers (SiPMs), the front 11a of the wafer 100 is protected and planarized by one or more dielectric layers or in general layers of material transparent at wavelengths of interest for the application, to form one or more spin-on-glass (SOG) layers. Other steps of deposition may be carried out prior to formation of the protective layer 62, and other materials may be used, provided that they are transparent at the wavelength/wavelengths of interest (in the case of SiPMs). The transparent protective layer 62 may be replaced by a generic protective layer of an opaque type in the case where the transparency at given wavelengths is not necessary for the particular application of the sensor devices 10, or is undesirable.

These deposited layers may be appropriately chosen by thickness, type, and refractive index in order for this multi-layer to have, in addition to the function of protection of the sensor, also an antireflection function.

There then may be carried out a step of planarization of the front 11a of the wafer 100 either by means of SOG techniques (deposition and planarizing etching) or by means of CMP or dry polishing or wet polishing.

Next (FIG. 19), via successive etching steps, an opening 64 is formed through the layers present on the front 11a of the wafer 100 (in the example shown, through the protective layer 62 and the insulating layer 54) until the diffused region 60 is reached. A conductive layer 68, for example a metal layer, is then deposited on the internal walls of the opening 64, and subsequently the opening 64 is completely or partially filled by formation of a further conductive layer 70, for example made of doped polysilicon. The conductive layer 70 extends on the front 11a of the wafer 100 also outside the opening 64 and forms a conductive access via between the front 11a of the wafer 100 (in particular, between the active area of the sensor devices 10 formed on the wafer 100) and the diffused region 60.

In the case where the technology of production of the device envisages a number of metallization levels on the front, any of these or a total or partial combination thereof may be used for the electrical connection between the vias and device/devices.

Formed in this way are the contact connections 13 and, in part, via holes 15 (in this step, the via holes 15 do not yet reach the back 11b of the wafer 100). Each via hole 15 comprises the internal portion 37 defined by the respective trench 36. In use, the conduction takes place, vertically, through the internal portion 37 of each via hole 15.

Then steps of processing of the back 11b of the wafer 100 are carried out.

For greater clarity of illustration, the subsequent FIGS. 20-24 show the wafer 100 as a whole, in the same view as that of the previous FIGS. 3-9, along the cross section III-III of FIG. 2.

Figure 20:
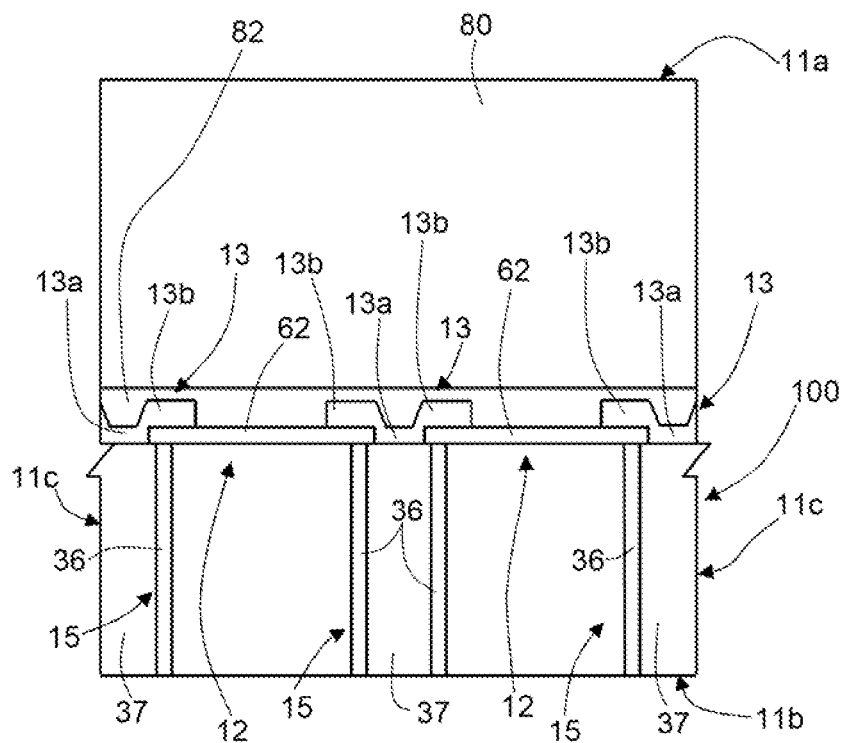
Figure 21:
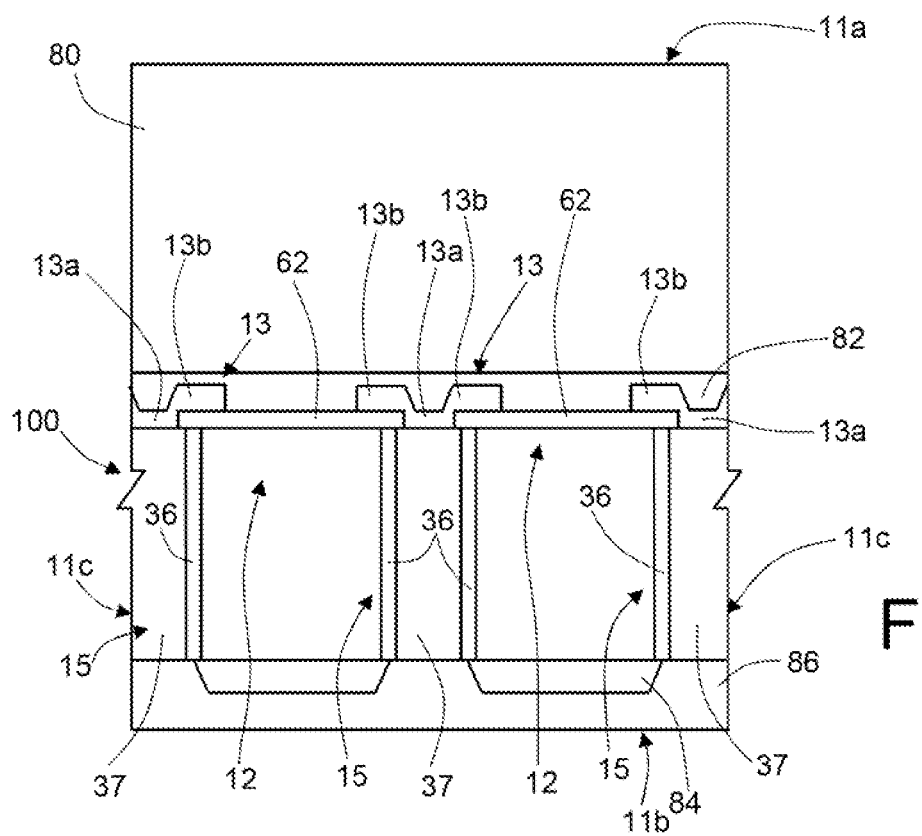
Figure 24:
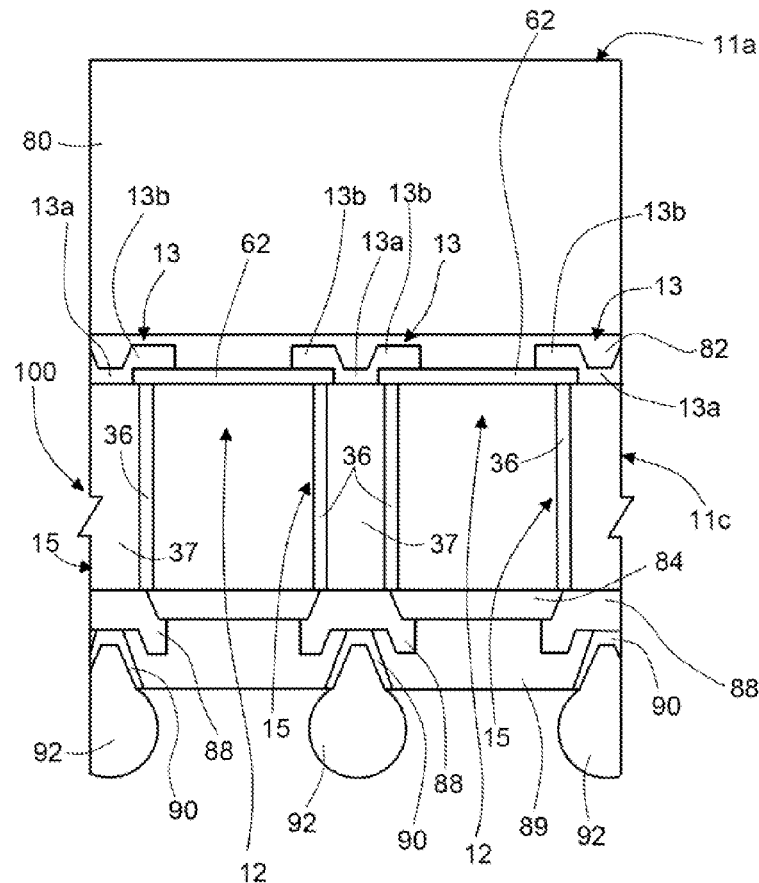
Figure 25:
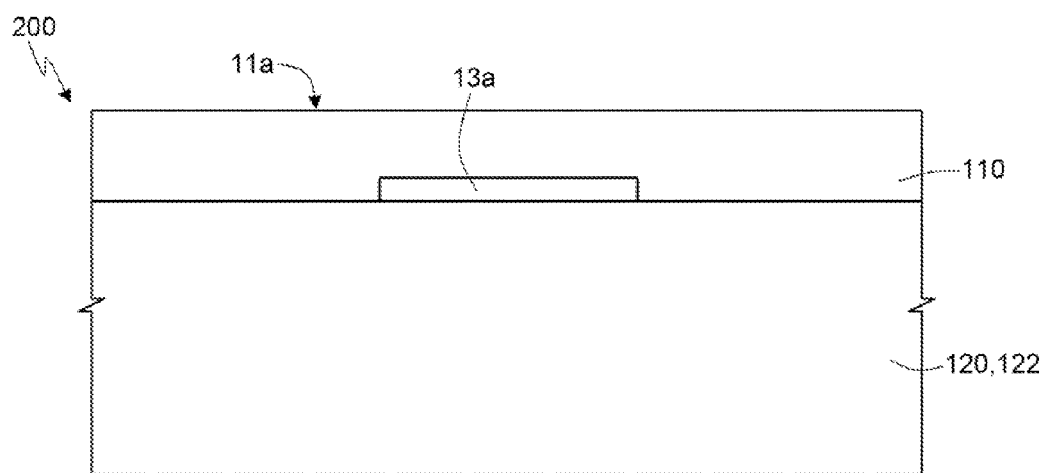
FIGS. 25-30 show successive manufacturing steps for obtaining vertical conductive connections according to a further embodiment.
Figure 26:
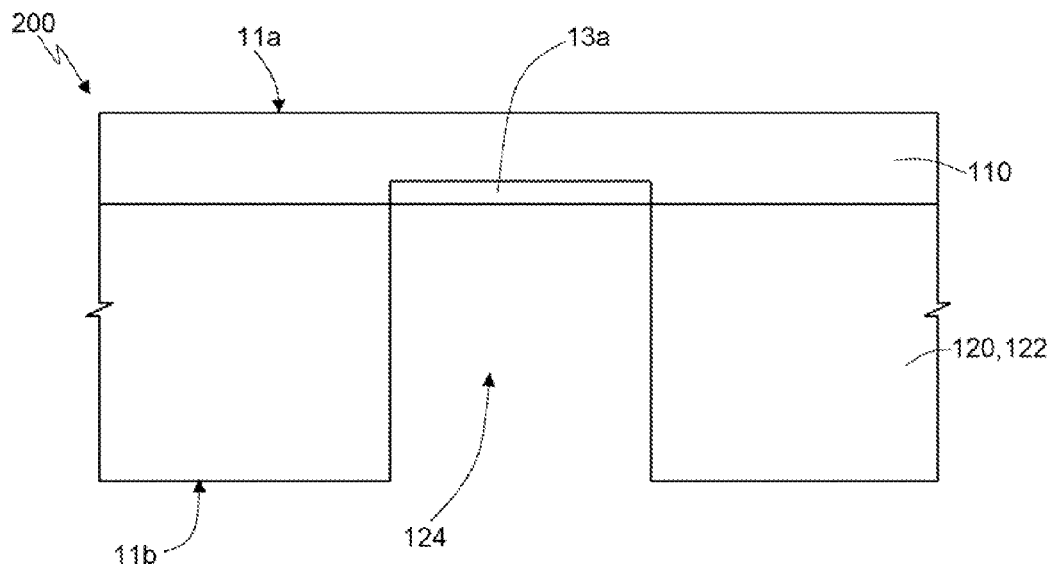
Figure 27:
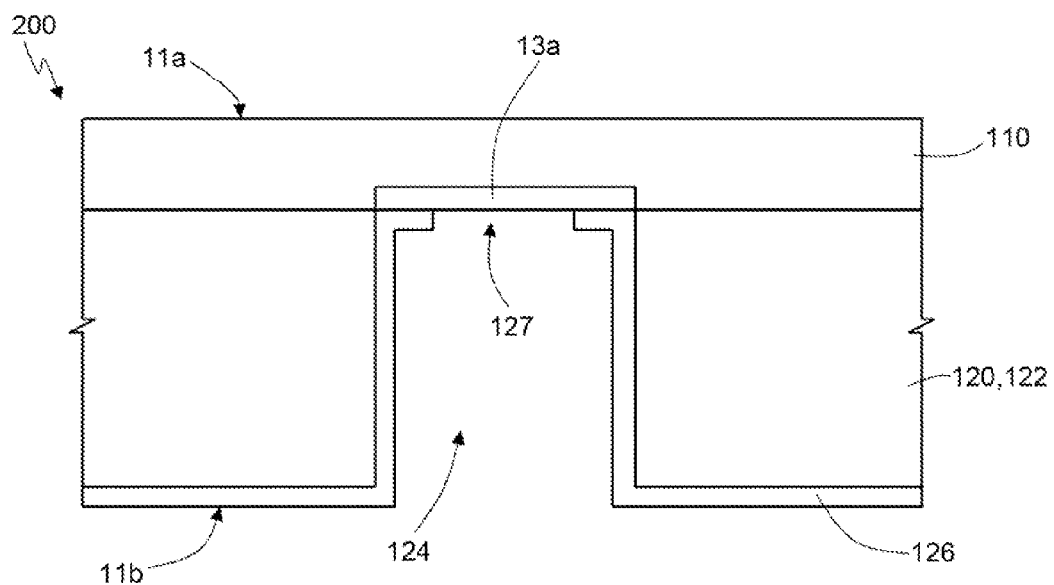
Figure 28:
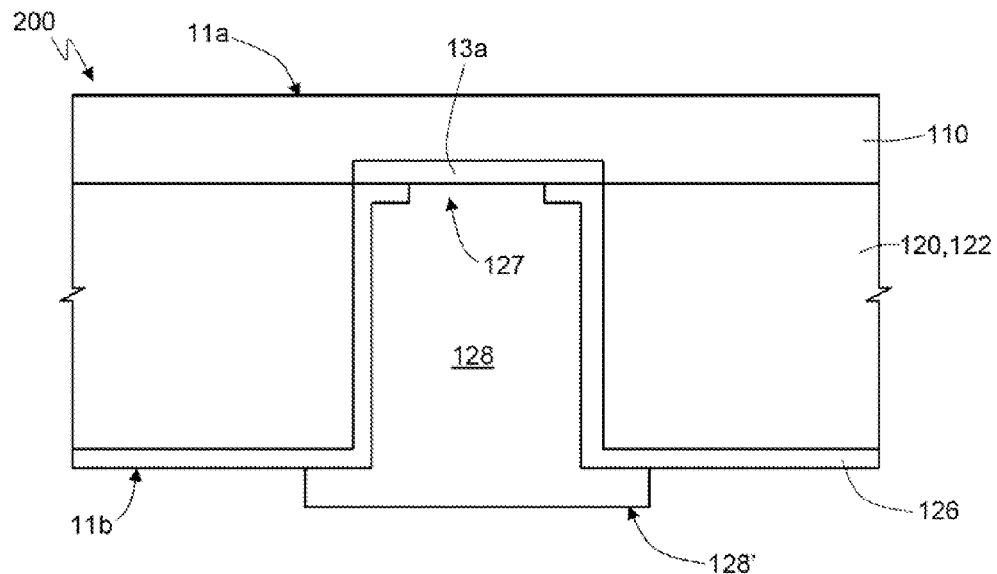
Figure 29:
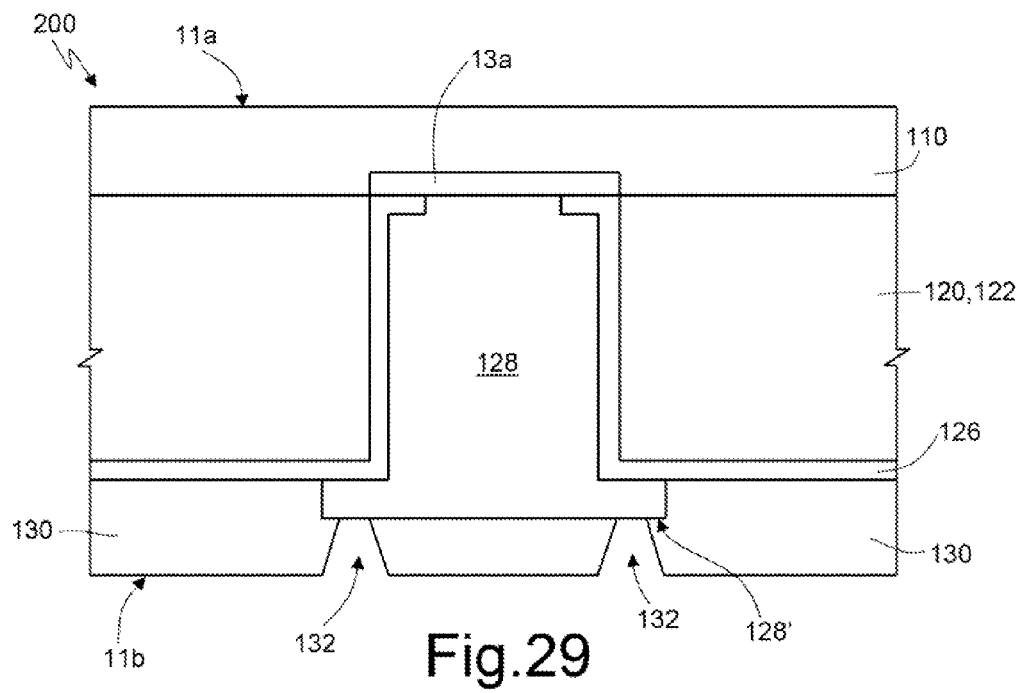
Figure 30:
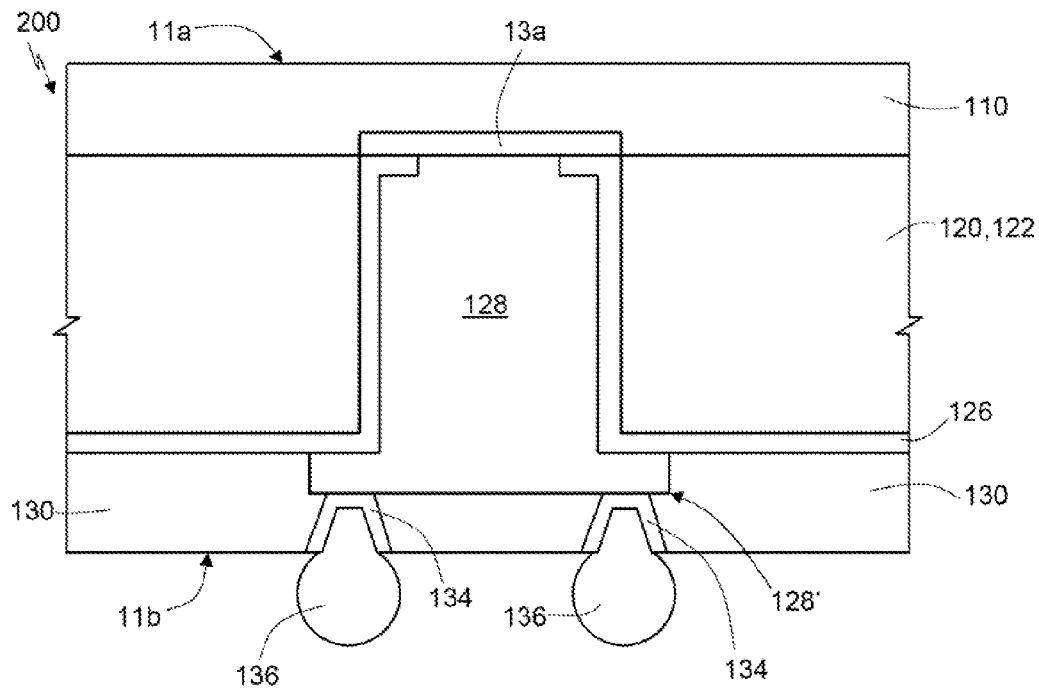

As shown in FIG. 20, the front 11a of the wafer 100 is provided with a support 80, for example of a temporary type (but, in the case where the support 80 does not alter operation of the sensor devices 10, the latter may also be of a permanent type). A support 80 of a temporary type may be made, for example, of silicon, glass or some other material. In the case where the application were to require on the final device a protective layer of a glass type, the support material may be made of glass and permanently bonded on the wafer.

Optionally, to improve adhesion between the front 11a of the wafer 100 and the support 80 and reduce the stresses that would be generated at the interface between different materials (for example, silicon-glass interface), before the step of providing the support 80 on the front 11a of the wafer 100, formed on the front 11a of the wafer 100 is an interface layer 82, for example made of the same material as that of the support 80. For instance, the interface layer 82 may be made of deposited silicon.

The adhesion between the support 80 and the interface layer 82 is carried out via bonding techniques of a known type using adhesives of a temporary or permanent type that are suited to the application and to the materials in question.

In the case where the final thickness of the device is smaller than the initial thickness of the wafer and hence the trenches 36 are still immersed in the substrate, to access the vertical connections a step of grinding of the back 11b of the wafer 100 is carried out. The thickness of the substrate 21 is reduced until the trenches 36 are exposed, completely insulating the internal region 37 (defined, as has been said, by each trench 36) from the external region 39 (the latter is hence separated from the respective internal region 37 by the respective trench 36 filled with non-conductive material). It may thus be possible to carry out a step of dry polishing of the back 11b of the wafer 100 or a CMP step.

Then conductive contacts are provided, from the back 11b of the wafer 100, in an area corresponding to each internal region 37 defined by the respective trench 36. The contacts are formed, in particular, with the internal regions 37 alone, also preventing contact of the regions 39 outside the trenches 36.

For this purpose (FIG. 21), formed on the back 11b of the wafer 100 is an insulating layer 84, made, for example, of silicon oxide deposited by means of low-temperature oxide (LTO) deposition. The process temperature in these steps for processing the back is dictated not only by the mechanical and chemical seal of the adhesive, but also by the metal present on the front of the wafer.

Alternatively, and in a way compatible with what has been said previously, the insulating layer 84 may be made of oxide grown thermally at a low temperature, or another type of insulating material, deposited with spinning and/or printing techniques.

By means of successive steps of lithography and etching, of a known type, selective portions of the insulating layer 84 are removed in an area corresponding to each internal region 37 so as to expose surface portions of the substrate 21 (in particular, of the back 11b).

In the particular case of a SiPM device, if the device has one of the contacts on the substrate and hence is to be contacted from the back, this contact may be provided simultaneously to the contacts of the via holes described previously.

Then, a step of formation of one or more conductive layers (designated, as a whole, in the figure by the reference number 86) is carried out on the back 11b of the wafer 100 and in particular in contact with the exposed surface of the internal regions 37, hence contacting each via hole 15. The conductive layers may, for example, comprise a first metal layer, having both the function of improving the adhesion and that of barrier, for example, titanium, or TiW, or TiTiN or TiTiONTi, in direct contact with each internal region 37, and a second metal layer, for example, an aluminium-silicon-copper (AlSiCu) alloy, deposited at low temperature, for example approximately 200° C., on the first layer.

In any case, the conductive layer(s) 86 may vary in shape, composition, and number according to the requirements of the device, to the available technology, and to the specific application.

Next (FIG. 22), the conductive layer 86 is selectively etched (for example, using an appropriate mask, not shown) for defining conductive contacts 88 separated from one another.

Said layer, in addition to enabling the connections of the back 11b with the via holes 15, is provided so as to redistribute the contacts of the back 11b of the final device in order to facilitate the connections and packaging thereof.

Next (FIG. 23), formed on the back 11b of the wafer 100 on top of the conductive contacts 88, is an insulating and protective layer 89 (passivation of the device). The insulating and protective layer 89 is etched in an area corresponding to the conductive contacts 88 until a surface portion of the conductive contacts 88 themselves is exposed.

In particular, in an embodiment where there is required a package that envisages bumps of bonding paste for mounting on a PCB, or in general an assembly of a flip-chip type, the procedure described hereinafter may be followed.

On the exposed surface portion of the conductive contacts 88 formed by sputtering, and then defined by lithography and etching, is a metallization layer 90 (under-bump metallization—UBM), which increases wettability and hence adhesion between the conductive layer and the bumps.

Finally (FIG. 24), bumps 92 (in particular, metal bumps) are formed in electrical contact, through the metallization layer 90 and the conductive contacts 88, with each via hole 15. The conductive region of each via hole 15 is hence the internal region 37 defined by the respective trench 36.

If the support 80 is of a temporary type, it may then be removed, as likewise the interface layer 82 (these steps not are shown in the figure).

According to a further embodiment, the conductive region of each via hole 15 is not the internal portion 37, but is formed by the trenches 36, which in this case are filled with conductive material (i.e., the fill layers 42 and 44 of the trenches 36 are made of conductive material). In order to provide an insulation of the trench 36, which is conductive, from the substrate 21 and from the epitaxial layer 33, the trench 36 is internally insulated by means of a layer of insulating material. With reference to what has already been described, the insulating layer 40 may achieve said purpose. According to such an embodiment, the via holes 15 are then insulated from the substrate 21 and from the epitaxial layer 22 by the dielectric deposited on the walls of the trenches 36; said dielectric may be indifferently a thermally grown oxide, or any other dielectric deposited by CVD techniques or a combination of these to provide a dielectric stack.

The fill layers 42 and 44 of the trenches 36 (which have, in use according to this embodiment, the function of conducting electrical current) are, for example, made of doped polysilicon or metal. In addition, the substrate 21 and the epitaxial layer 22 are made of semiconductor material.

Figure 19:
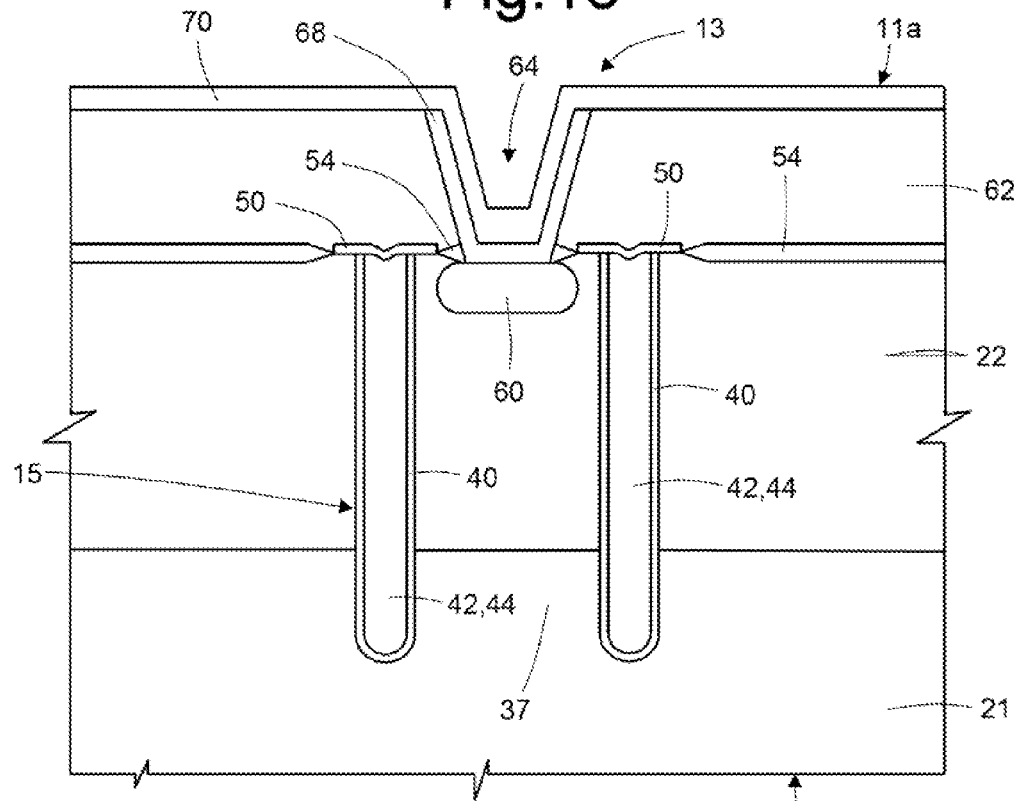

The step of formation of the opening 64 of FIG. 19 is moreover modified. In detail, in this case, an opening 64 is formed above each trench 36 in such a way as to expose surface portions of conductive material used for filling the respective trench 36. In this way, the successive steps of deposition of conductive layers 68 and 70 enable contacting of each trench 36 and provision of a conductive path through the respective trench 36 towards the back 11b of the wafer 100.

Although the trenches 36 may not have the shape described with reference to FIGS. 9a and 9b and shown in said figures, they may have an extremely wide range of geometries. In an embodiment, each trench does not define an internal region 37 of semiconductor material. In this case, in the step of formation of the trench, the internal region 37 of semiconductor material shown in FIGS. 9a and 9b is completely removed and, during the subsequent steps of filling of the trench, the latter is completely filled with conductive material, for example metal or doped polysilicon. The entire trench hence functions as conductive path for setting in contact the front 11a of the wafer with the back 11b.

For all the embodiments described, the trenches and the corresponding conductive path that defines them are provided in the safety regions 16 (see FIG. 2), substantially in an area corresponding to the scribe lines.

Processing of the back will be carried out following the same technological steps as those described previously, with the sole difference that the electrical contacts for the vias will be provided so as to contact the trench electrically.

FIGS. 25-30 show, in cross-sectional view along the line of section X-X of FIG. 2, according to a further embodiment of the present disclosure, a method of formation of the via holes 15 alternative to the method shown in FIGS. 3-24 and described with reference to said figures.

A method according to an embodiment of FIGS. 25-30 differs from a method according to an embodiment of FIGS. 3-24 in so far as the etching step for formation of the trenches 36 is carried out from the back 11b of the wafer 100, and not from the front 11a. Said step is performed after production and completion of the device on the front 11a, (temporary or permanent) bonding with a substrate, which may be made of glass, silicon, etc. Said substrate has the function of protecting the front 11a during processing of the back 11b, as well as the function of mechanical support in the case where it were to be decided to provide devices having a small thickness ranging from approximately a few tens of micrometers to a few hundreds of micrometers, and also during thinning-out and polishing of the back of the wafer to achieve the desired thickness (for example, by grinding, polishing, CMP, and spin etching or a combination thereof). There is obtained in this case an advantage of minimal interference, during formation of the via holes 15, with the steps of creation of the sensor devices 10 on the front 11a of the wafer 100.

In greater detail (FIG. 25), a wafer 200 is provided, comprising a substrate 120, made, for example, of silicon, and an epitaxial layer 122, formed on a front side 11a of the substrate 120.

The epitaxial layer 122 may be omitted.

For simplicity of description, it is here assumed that the front 11a of the wafer 200 has already been processed as desired; for example, it is assumed that sensor devices 10 have already been provided. It is moreover assumed that surface metallizations have already been made, in a known way by means of successive steps of deposition, lithography, and etching, to define, just on the front 11a of the wafer 100, the central portion 13a and the lateral portion 13b of each contact coupling 13. As has already been said with reference to FIG. 2, the surface metallizations of each contact coupling 13 are provided in the portion of the wafer 200 dedicated to the scribe lines.

The front 11a of the wafer 100 may be protected by means of a protective layer 110, for example of glass or of transparent plastic material or again of opaque material in the case where exposure to light of the sensor devices 10 is not significant or even undesirable. If it proves useful for the subsequent processing steps, it is moreover possible to provide the front 11a of the wafer 100 (on top of the protective layer 110) with a support (not shown) similar to the support 80 shown in FIGS. 20-24.

Then (FIG. 26), an (optional) step of thinning from the back 11b of the wafer 100 (by the "grinding" technique) and subsequent polishing are carried out. Following upon these operations, the wafer 200 has a thickness of between approximately 10 μm and 500 μm, for example, approximately 100 μm. During this step of thinning of the wafer 200 it may be possible for part of the substrate 120 (or all the substrate 120) to be removed. But this does not apply to the case where an epitaxial layer 122 is not present but the substrate 120 itself is directly processed.

An etching of the back 11b of the wafer 200 is then carried out to form an opening 124 in an area corresponding to the central portion 13a of the contact coupling 13. The etching through the epitaxial layer 122 stops once the metallization that forms the central portion 13a of the contact coupling 13 is reached. The opening 124 may be provided in a known way by means of dry etching, for example RIE or DRIE, wet etching, or laser or mechanical drilling, or some other technique.

The alignment between the front 11a and the back 11b of the wafer 200 to provide the opening 124 in an area corresponding to the central portion 13a of the contact connection 13 may be carried out by means of techniques and/or instruments for front-back alignment of a known type. A possibility is represented by the creation of alignment marks on the back 11b of the wafer having as reference similar marks on the front 11a so as to obtain a lithographic alignment of the structures already present on the front 11a with the structures that will be created on the back 11b of the wafer. These marks are formed by means of front-back lithography (for example, using a double-side mask aligner, in itself known, which, by reading the marks on the front of the wafer exposes alignment markers, for example, on a layer of photoresist that is formed on the back of the wafer after reduction in thickness and polishing). The subsequent etching of the silicon (whether wet or dry) and removal of the photoresist completes this process step. The creation of these marks (of a type known as "zero layer") enable references to be obtained for all the subsequent steps.

Alternatively, it may be possible to omit this step by aligning directly the first useful level, which is the one used for formation of the via holes.

Next (FIG. 27), a dielectric layer 126 is formed, made, for example, of silicon nitride or silicon oxide or of a polymeric type, on the back 11b of the wafer 200 so as to cover the side wall and the end of the opening 124 (hence covering the exposed central portion 13a of the contact connection 13 internal to the opening 124). In this way, the opening 124 is insulated from the substrate 120 and from the epitaxial layer 122.

Next, using an appropriate mask (not shown), for example made of photoresist, an etching step is carried out for exposing a contact region 127 of the central portion 13a of the contact connection 13. After this step, the dielectric deposited previously covers the back of the wafer and the internal walls of the trenches 124 previously provided but is removed (at least partially) from the bottom of the trenches 124 so as to expose the metal layer provided on the front 11a of the wafer, in a region designed to house the contacts for connecting active-area regions of the final device.

Next (FIG. 28), a conductive layer 128 is formed, for example made of metal deposited via sputtering or electrochemical deposition (ECD), which extends inside the opening 124 until the central portion 13a of the contact coupling 13 is contacted via the contact region 127 exposed during the step described with reference to the previous figure. The conductive layer 128 is then removed from the back 11b of the wafer 200 except for a region 128' extending on the back 11b of the wafer 200 laterally with respect to the opening 124. In this step, a system of couplings is simultaneously provided, which redistributes the couplings of the front on the back in such a way that they are accessible and geometrically compatible for final assembly of the device.

Next (FIG. 29) an insulating layer 130 is formed, for example by depositing a passivation layer, designed to insulate electrically and protect the conductive layer 128, and, through the insulating layer 130 and in an area corresponding to the region 128', one or more holes 132 are opened until a portion of the underlying region 128' is reached and exposed.

Formed in said holes 132 (FIG. 30) is a contact layer 134 (having the function of UBM, as described previously).

Finally, bumps 136 (for example, metal bumps) are formed in an area corresponding to each of the holes 132 provided with UBM.

For one or more embodiments described, at the end of the step of formation of the bumps, the wafer (wafer 100 or wafer 200) is diced along the scribe lines 14 (see FIG. 2), so as to isolate the sensor devices 10 from one another.

FIG. 31 shows in perspective view a portion of a die 11 after dicing. For simplicity of representation, FIG. 31 does not show in detail the layers through which the via holes 15 extend, but a generic omni-comprehensive single layer 250 is shown. FIG. 31, for clarity and simplicity of representation, does not even show possible layers that extend either on top or underneath the omni-comprehensive layer 250. The via holes 15 may be obtained according to an embodiment described with reference to FIGS. 3-24 or with reference to FIGS. 25-30.

As may be noted, following upon dicing, the via holes 15 extend vertically along respective lateral surfaces 11c of the die 11. Schematically represented on the front 11a of the die 11 is, by means of a dashed line, the active area 12, comprising conductive pads 260 and 261, of a generic electronic device (not shown) provided on and/or in the die 11. Each via hole 15 may be connected to a respective conductive pad 260, 261 via the respective contact connection 13, which extends between the via hole 15 and a conductive pad 260, 261 forming a conductive path, which, from the peripheral edge of the die 11 extends into the active area 12. Moreover shown are bumps 92, 136, formed on the back 11b of the die 11. The bumps 92, 136 are shown in the figure, for simplicity of representation and for greater clarity, aligned vertically to each respective via hole 15, although such vertical alignment is not required.

For example, it is evident that the bumps 92, 136 may be coupled to each via hole 15 by means of a conductive path provided on the back 11b of the die laterally arranged at a distance from the via holes 15, and not vertically aligned as shown in the figure. This may be for preventing also the bumps 92, 136 from being cut during the step of dicing of the wafer, or to locate a bump in a location different from the location of the via hole 15 to which the bump is coupled.

The bumps may be coupled, for example by means of bonding, in a known way, with an integrated circuit board. More in general, the die thus obtained, owing to its integrability with the technology typical of semiconductors, may find use in a wide range of applications, and in particular may provide a valid technological alternative in all those cases in which it may be necessary to "pack together" different chips or dice, for example so that they are coupled vertically to form three-dimensional structures belonging to one and the same system. The three-dimensional integration that may be obtained may be homogeneous and, above all, heterogeneous.

In addition, the integrability on silicon substrates, and in general semiconductor substrates, may enable applicability of an embodiment to applications both of a consumer and of a professional type, but above all in all those sectors where a high circuit complexity may be required or in which it may be necessary to couple together devices having different functions and/or obtained with different technologies, but also in all those sectors where it is low cost that may fix the limits of the application.

Figure 32:
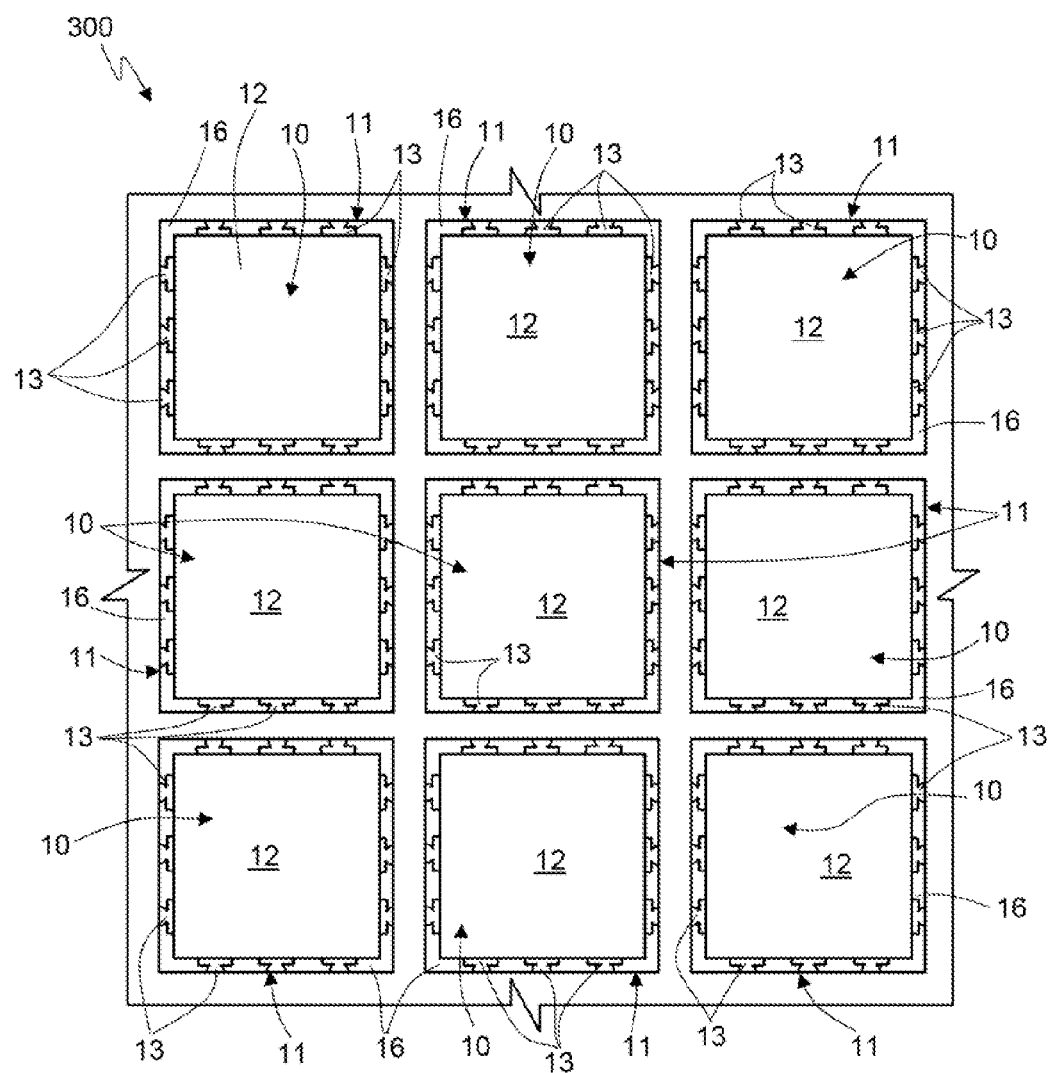
FIG. 32 shows a sensor panel of large dimensions comprising a plurality of dies of the type shown in FIG. 2 and produced according to an embodiment of a manufacturing method illustrated in FIGS. 3-24 or according to an embodiment of a manufacturing method illustrated in FIGS. 25-30.

FIG. 32 shows a sensor panel 300 of large dimensions comprising a plurality of dies 11, each of which carries a respective sensor device 10, provided with via holes and corresponding connection bumps obtained according to an embodiment.

The dies 11 are arranged according to a two-dimensional-array organization, with a high degree of compactness. The sensitive area (active area 12) of each sensor device 10 (and consequently of the entire sensor panel 300) is maximized, in so far as the via holes 15, the contact connections 13, and, on the back of the die 11, the bumps 92 (or the bumps 136), are formed in edge portions (designated by the reference number 16) of each die, outside the active area 12 of the sensor device 10.

From an examination of the characteristics of an embodiment provided according to the present disclosure, advantages that it affords are evident.

First, an embodiment may be applied to the construction of any device without altering the characteristics thereof. In fact, the process sequence, which may be numbered among the processes of formation of through silicon vias (TSVs) basically differs from standard processes as regards the production of the TSVs owing to the fact that each TSV is located outside the active area of the device, in particular in a point corresponding to the scribe lines. An embodiment may hence be applied also to other processes of formation of TSVs different from the ones described.

In addition, according to an embodiment, the number of trenches that it is necessary to provide, in each wafer, to form the TSVs may be practically halved, as compared to approaches for via-last formation of TSVs of a known type.

An embodiment affords, in addition to advantages in terms of overall dimensions and increase of the fill factor, also an advantage in terms of simplicity of machining of the wafers from a mechanical standpoint in so far as the wafers provided with TSVs along the scribe lines may be more resistant and hence more reliable as compared to wafers in which the TSVs are provided inside the active area of the devices.

Finally, it is clear that modifications and variations may be made to one or more embodiments described and illustrated herein, without thereby departing from the scope of the disclosure.

In particular, even though the description has made explicit reference to a sensor device, in particular to a SiPM, an embodiment may be applied to any other device, in particular to devices in which the maximization of active area leads to advantages, for example in terms of efficiency, fill factor, etc. Said devices may be for example, all the types of sensors, in particular of an optical type, as well as optical sources of a solid-state LED or laser type but more in general any device that is mounted according to the flip-chip or stacked 3D technology with one or more other devices.

Finally, it is evident that the steps described with reference to FIGS. 4-8 for formation of the edge-protection elements 29, 30 are not necessary in the case where it is not desired to obtain the protection provided by said edge-protection elements 29, 30 (as described previously).

Furthermore, referring, for example, to FIG. 18, in an embodiment a via 15 may have two conductive paths, the path 37 being a first path, and a second path within the trench 36, where an insulator such as the insulator 40 isolates these paths from each other and from the surround portions of the substrate 21 and epitaxial layer 22. Such a via may be useful for differential signals or to form a transmission line.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A semiconductor device comprising:
a semiconductor die having a front surface and a back surface;
an active semiconductor sensor area on the front surface of said semiconductor die;
a semiconductor safety area in said semiconductor die surrounding said active sensor area;
at least one first conductor on said semiconductor safety area electrically coupled to said active sensor area;
at least one insulating layer extending vertically through the semiconductor safety area between the front and back surfaces of said substrate and laterally spaced apart from said active sensor area; and
at least one second conductor extending vertically through said semiconductor safety area and electrically insulated therefrom by said at least one insulating layer, said at least one second conductor electrically coupled to said at least one first conductor at the front surface of said substrate.

2. The semiconductor device of claim 1 wherein said active sensor area comprises a light sensor area.

3. The semiconductor device of claim 1 wherein said at least one first conductor comprises a lateral portion electrically coupled to said active sensor area and having a first shape, and a central portion electrically coupled to said lateral portion and to said at least one second conductor and having a second shape different than the first shape.

4. The semiconductor device of claim 3 wherein the first shape is a rectangular shape, and the second shape is a semi-cylindrical shape.

5. The semiconductor device of claim 4 wherein said at least one insulating layer has a hollow semi-cylindrical shape.

6. The semiconductor device of claim 5 wherein said at least one second conductor has a semi-cylindrical shape.

7. The semiconductor device of claim 1 wherein said at least one first conductor comprises a plurality thereof spaced apart on said semiconductor safety area around said active sensor area; and wherein said at least one insulating layer and said at least one second conductor comprises a respective insulating layer and second conductor for each first conductor.

8. The semiconductor device of claim 1 further comprising a conductive bump adjacent the back surface of said active sensor area electrically coupled with said at least one second conductor.

9. A sensor module comprising:
a substrate; and
at least one semiconductor device coupled to said substrate and comprising
a semiconductor die having a front surface and a back surface,
an active sensor area on the front surface of said semiconductor die,
a semiconductor safety area in said semiconductor die surrounding said active sensor area,
at least one first conductor on said semiconductor safety area electrically coupled to said active sensor area,
at least one insulating layer extending vertically through the semiconductor safety area between the front and back surfaces of said substrate and laterally spaced apart from said active sensor area, and
at least one second conductor extending vertically through said semiconductor safety area and electrically insulated therefrom by said at least one insulating layer, said at least one second conductor electrically coupled to said at least one first conductor at the front surface of said substrate.

10. The sensor module of claim 9 wherein said active sensor area comprises a light sensor area.

11. The sensor module of claim 9 wherein said at least one first conductor comprises a lateral portion electrically coupled to said active sensor area and having a first shape, and a central portion electrically coupled to said lateral portion and to said at least one second conductor and having a second shape different than the first shape.

12. The sensor module of claim 11 wherein the first shape is a rectangular shape, and the second shape is a semi-cylindrical shape.

13. The sensor module of claim 12 wherein said at least one insulating layer has a hollow semi-cylindrical shape.

14. The sensor module of claim 13 wherein said at least one second conductor has a semi-cylindrical shape.

15. The sensor module of claim 9 wherein said at least one first conductor comprises a plurality thereof spaced apart on said semiconductor safety area around said active sensor area; and wherein said at least one insulating layer and said at least one second conductor comprises a respective insulating layer and second conductor for each first conductor.

16. The sensor module of claim 9 further comprising a conductive bump adjacent the back surface of said active sensor area electrically coupled with said at least one second conductor and said substrate.

* * * * *